(12) United States Patent
Chou et al.

(10) Patent No.: US 12,206,004 B2
(45) Date of Patent: Jan. 21, 2025

(54) GATE ALL AROUND DEVICE AND METHOD OF FORMING THE SAME

(71) Applicant: Taiwan Semiconductor Manufacturing Company, Ltd., Hsinchu (TW)

(72) Inventors: Hung-Ju Chou, Hsinchu (TW); Yen-Po Lin, Taipei (TW); Jiun-Ming Kuo, Taipei (TW); Yuan-Ching Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 439 days.

(21) Appl. No.: 17/662,380

(22) Filed: May 6, 2022

(65) Prior Publication Data
US 2023/0010541 A1    Jan. 12, 2023

Related U.S. Application Data

(60) Provisional application No. 63/219,636, filed on Jul. 8, 2021.

(51) Int. Cl.
*H01L 29/66* (2006.01)
*H01L 29/06* (2006.01)
*H01L 29/423* (2006.01)
*H01L 29/78* (2006.01)
*H01L 29/786* (2006.01)

(52) U.S. Cl.
CPC .... *H01L 29/42392* (2013.01); *H01L 29/0673* (2013.01); *H01L 29/66545* (2013.01); *H01L 29/785* (2013.01); *H01L 29/78696* (2013.01); *H01L 2029/7858* (2013.01)

(58) Field of Classification Search
CPC ............. H01L 29/78696; H01L 29/785; H01L 29/66545; H01L 29/42392; H01L 29/7858
See application file for complete search history.

(56) References Cited

U.S. PATENT DOCUMENTS

| 8,796,666 | B1 | 8/2014 | Huang et al. |
| 8,815,712 | B2 | 8/2014 | Wan et al. |
| 8,963,258 | B2 | 2/2015 | Yu et al. |
| 9,093,530 | B2 | 7/2015 | Huang et al. |

(Continued)

*Primary Examiner* — Hoa B Trinh
(74) *Attorney, Agent, or Firm* — Haynes and Boone, LLP

(57) ABSTRACT

A method includes forming a p-well and an n-well in a substrate. The method further includes forming a stack of interleaving first semiconductor layers and second semiconductor layers over the p-well and the n-well, the first semiconductor layers having a first thickness and the second semiconductor layers having a second thickness different than the first thickness. The method further includes annealing the stack of interleaving semiconductor layers. The method further includes patterning the stack to form fin-shaped structures including a first fin-shaped structure over the n-well and a second fin-shaped structure over the p-well. The method further includes etching to remove the second semiconductor layers from the first and second fin-shaped structures, where the first semiconductor layers have a different thickness within each of the first and second fin-shaped structures after the etching. The method further includes forming a metal gate over the first and second fin-shaped structures.

20 Claims, 35 Drawing Sheets

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2013/0285116 A1 | 10/2013 | Lochtefeld et al. |
| 2020/0006577 A1* | 1/2020 | Ching ............... H01L 29/66545 |
| 2020/0098879 A1 | 3/2020 | Lee et al. |
| 2020/0168715 A1 | 5/2020 | Wu et al. |
| 2022/0238699 A1* | 7/2022 | Chiang ............... H01L 27/0886 |

\* cited by examiner

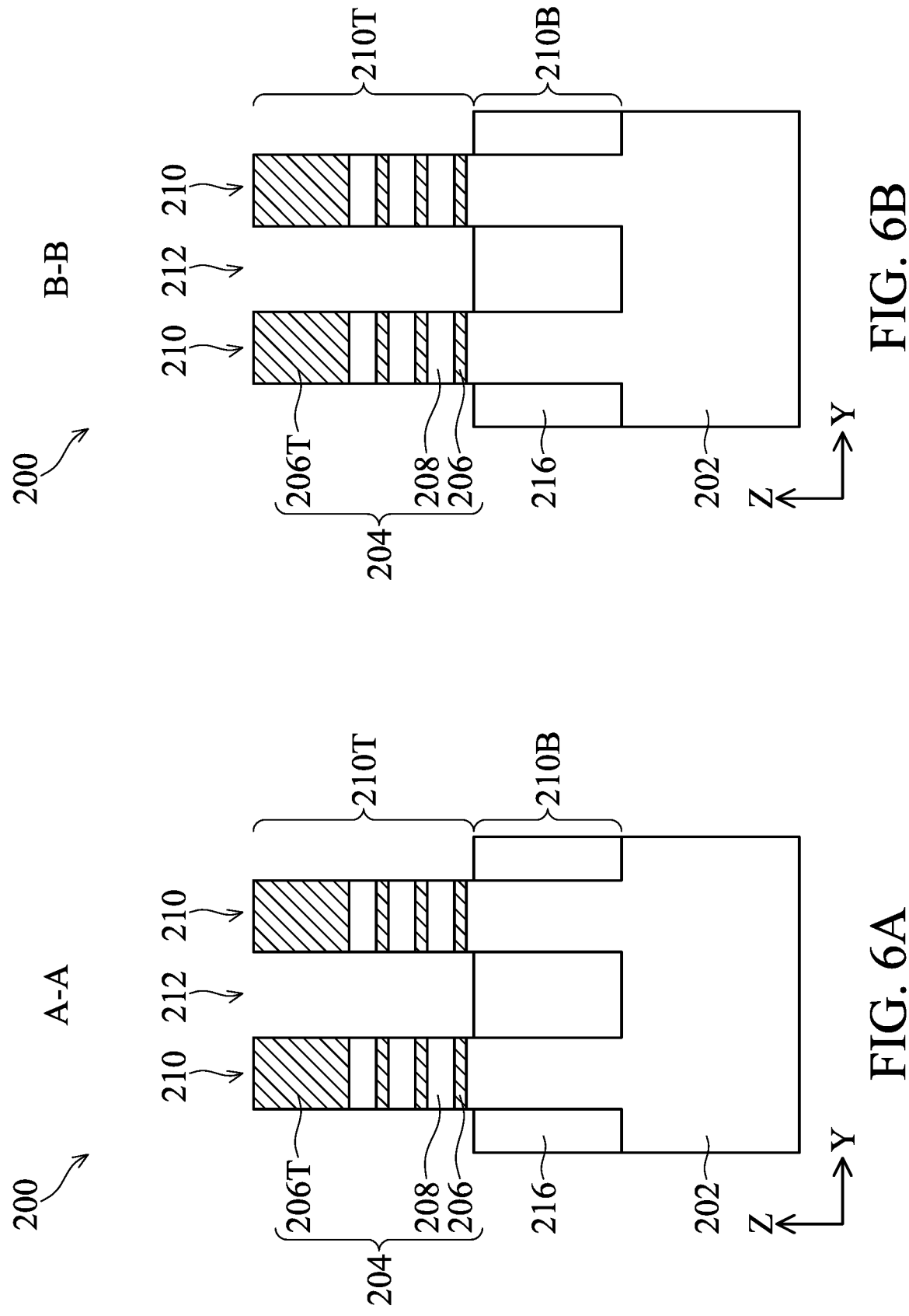

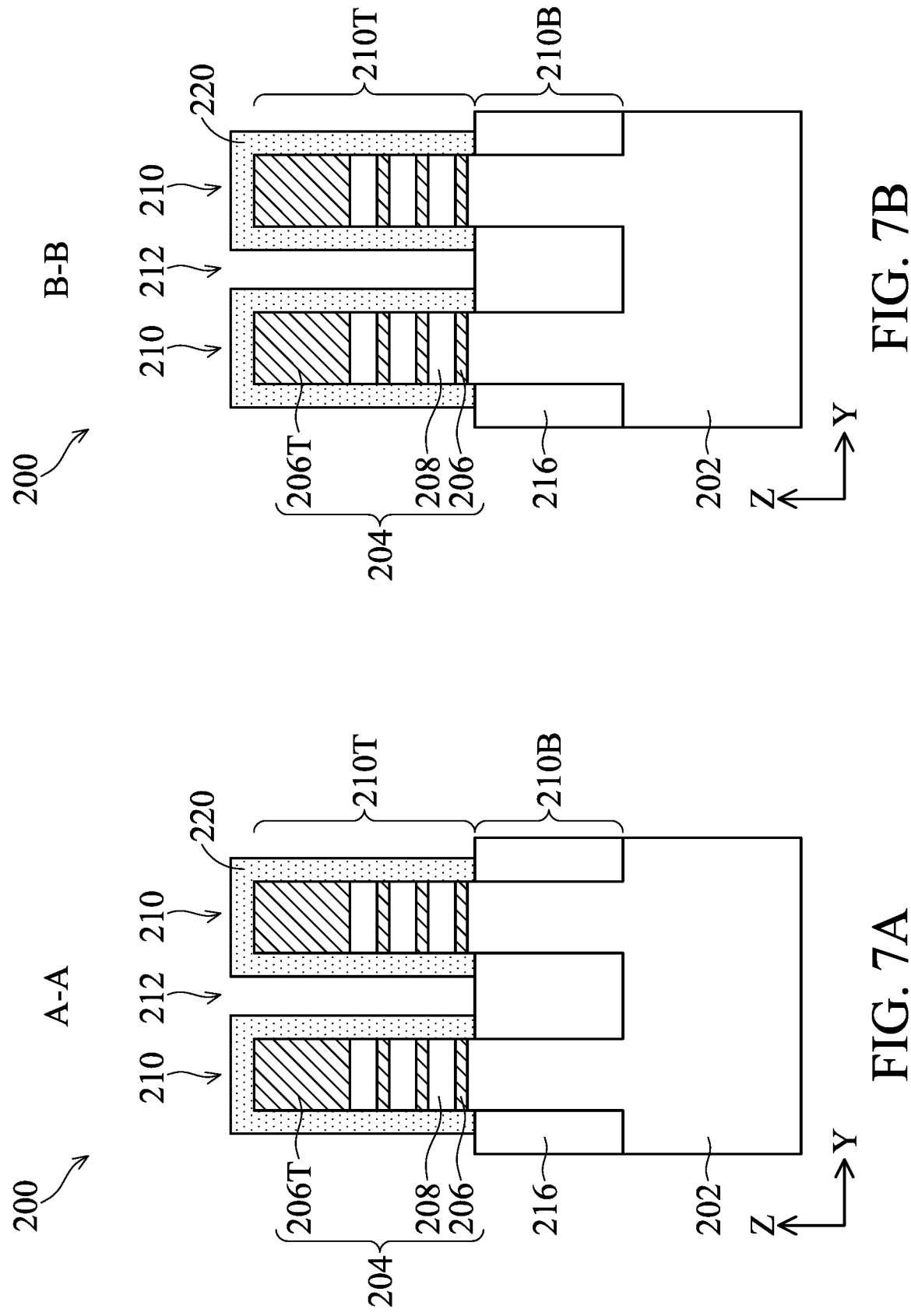

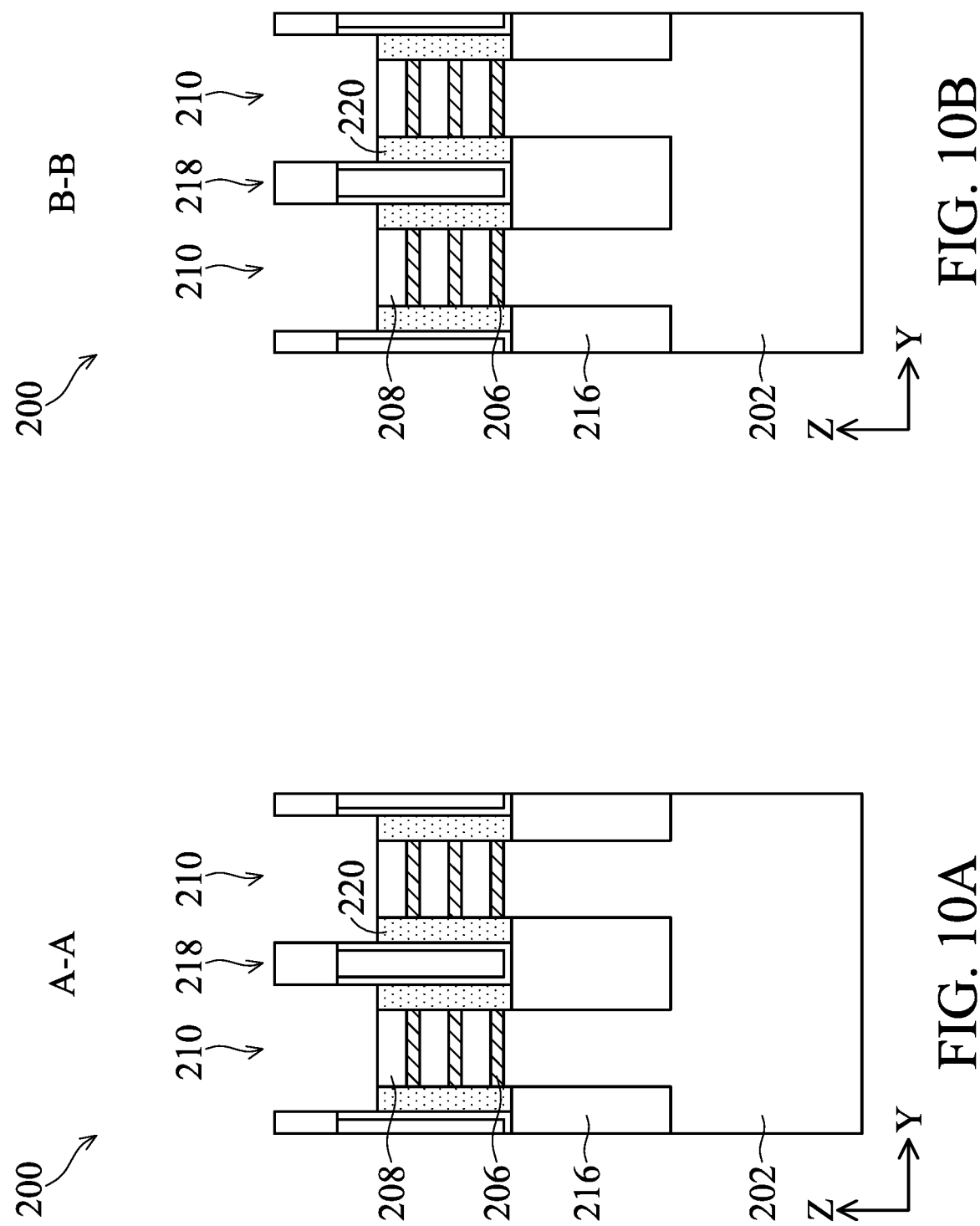

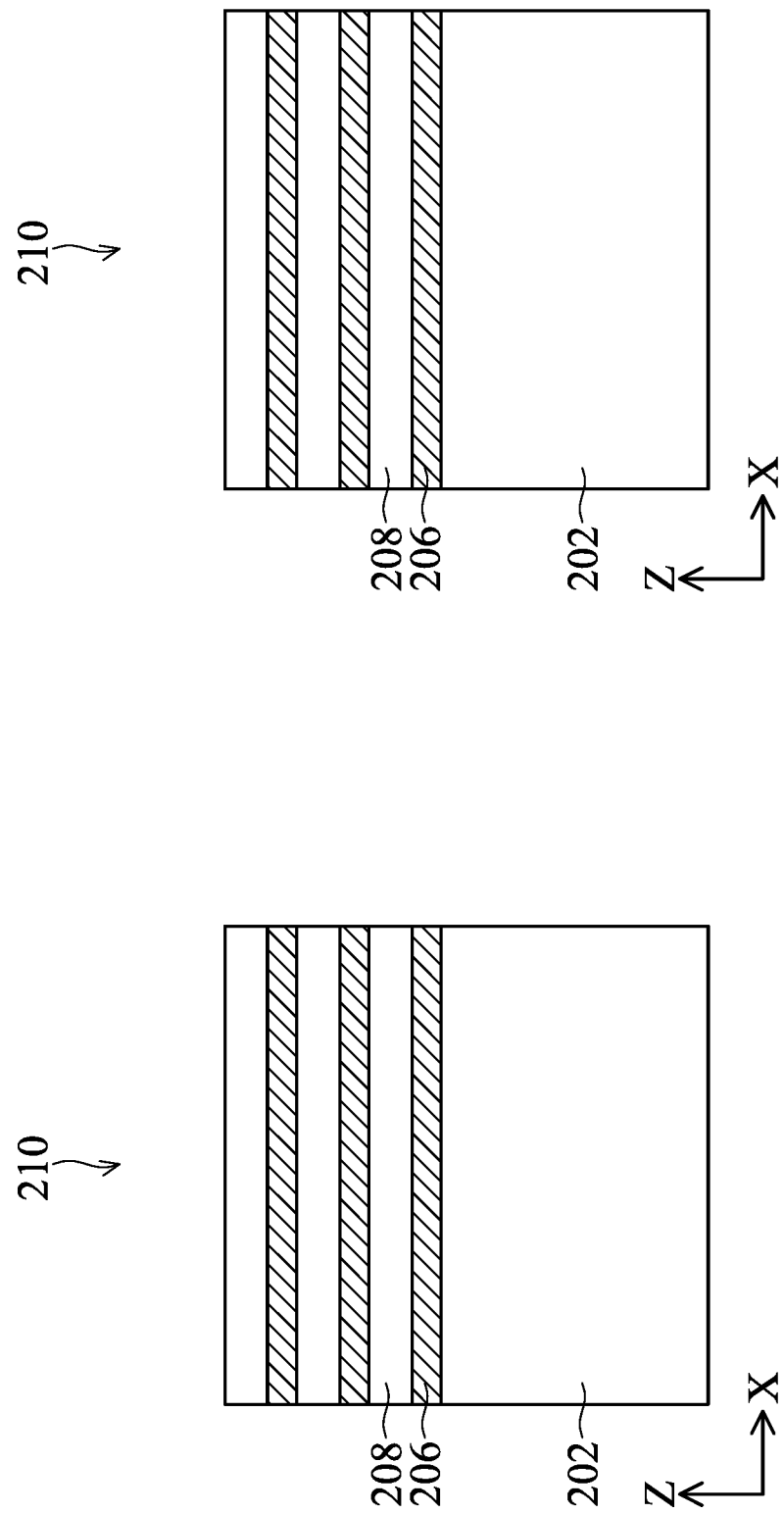

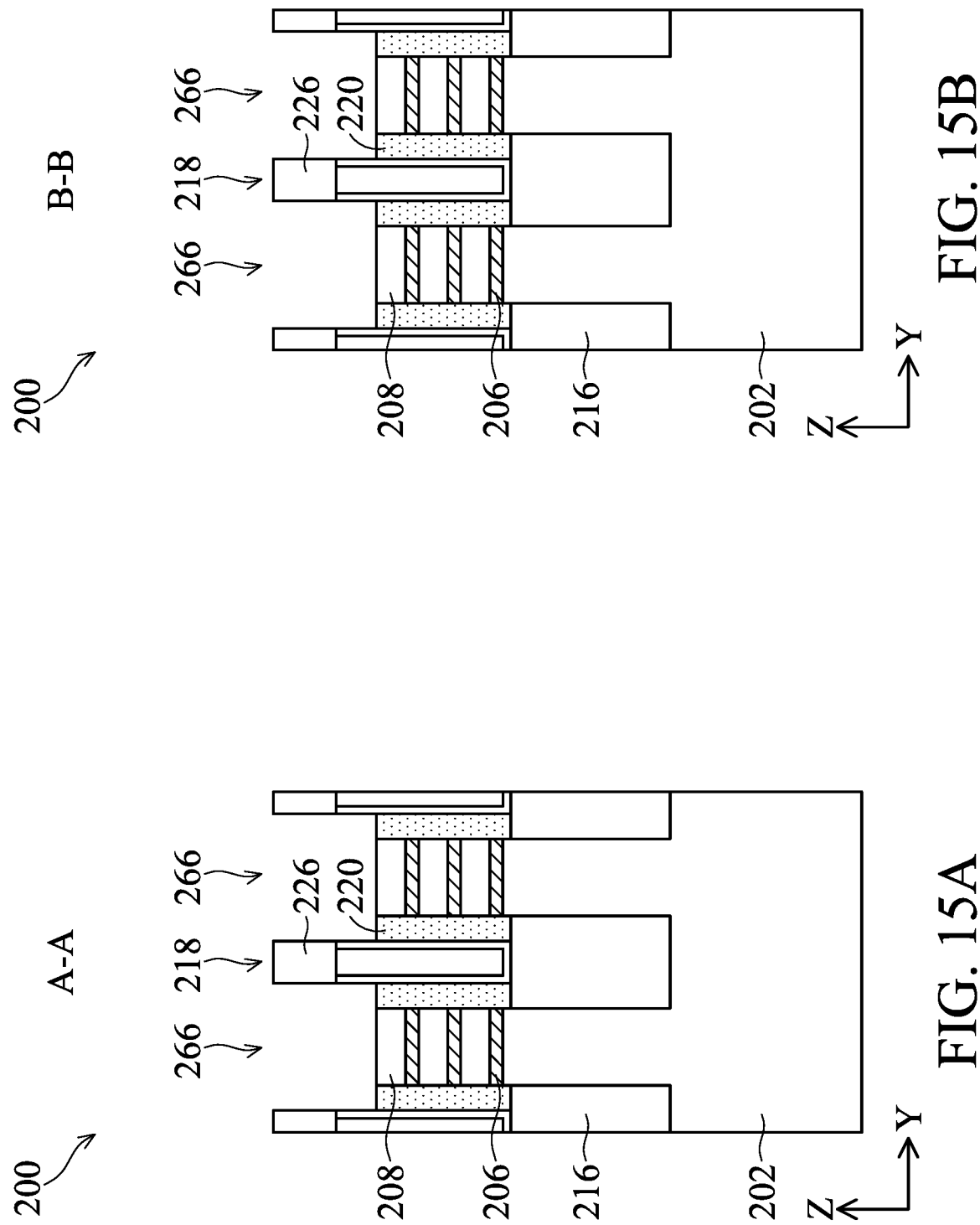

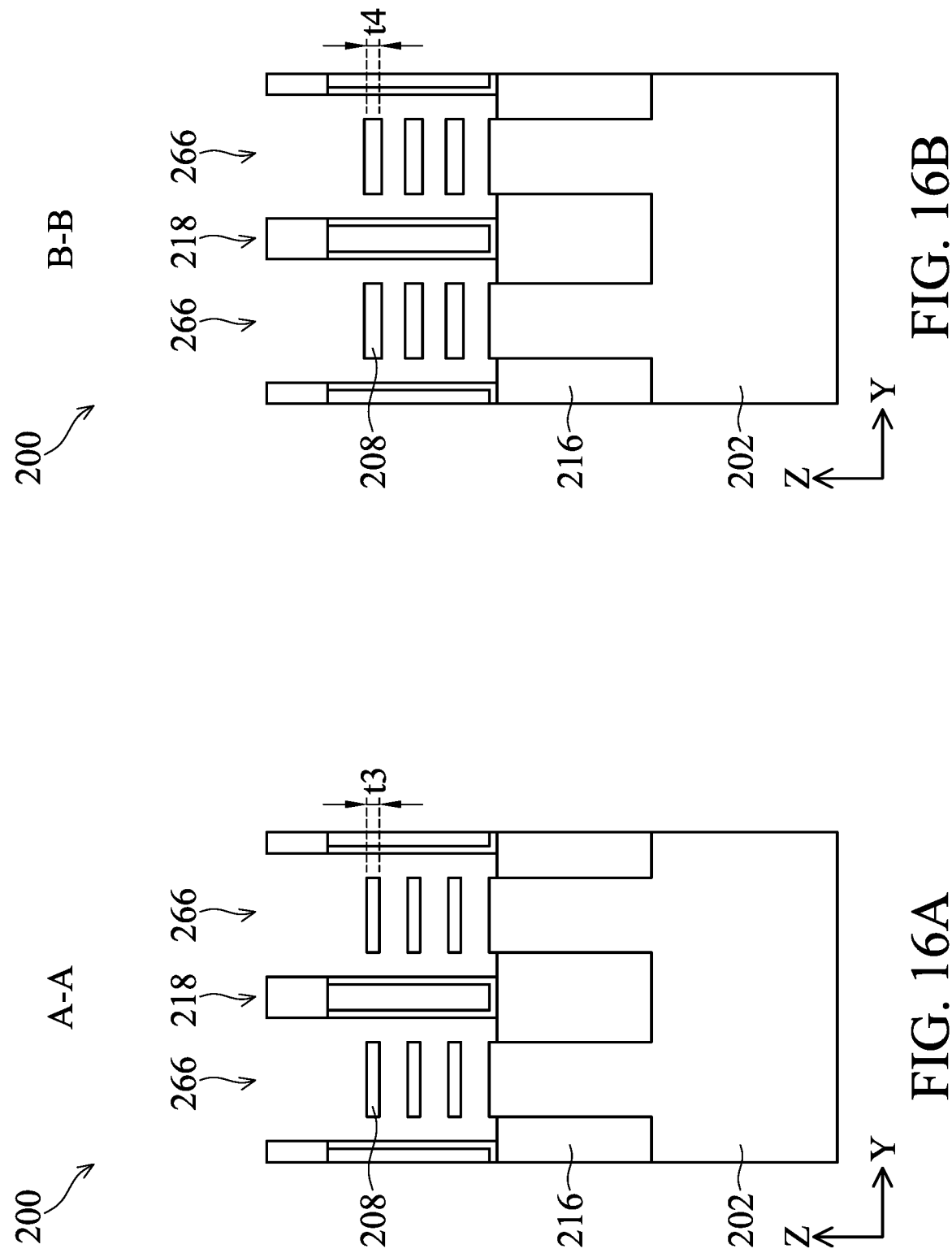

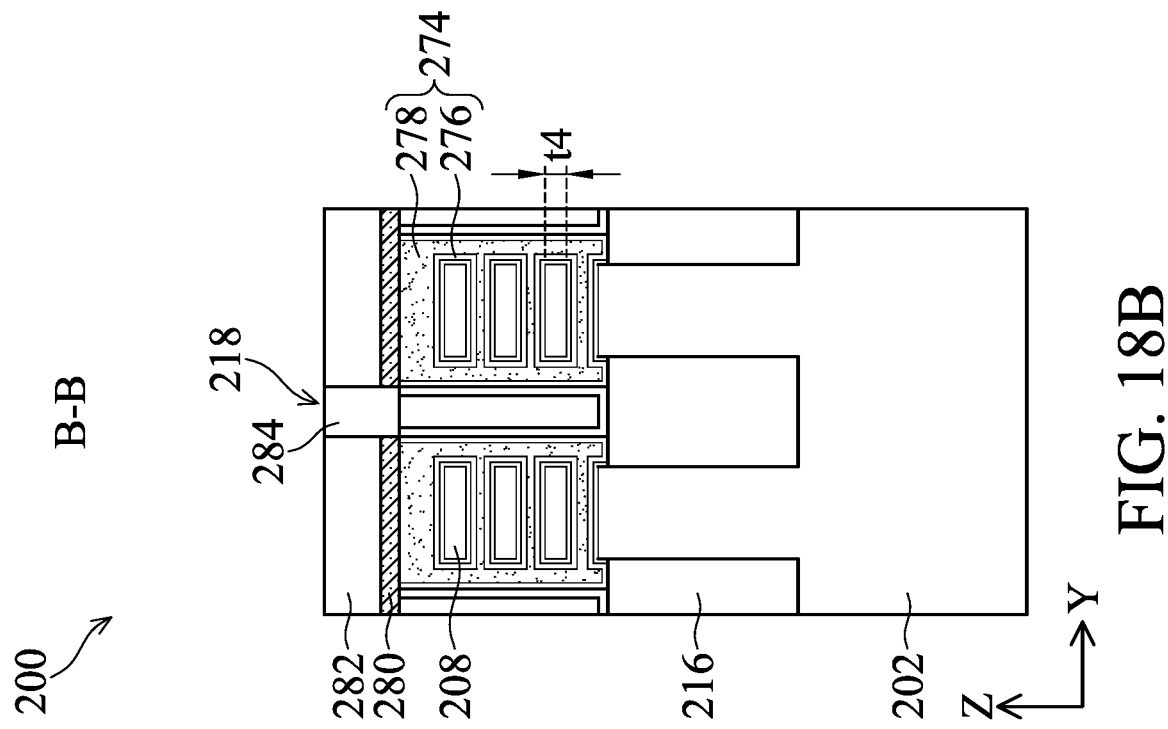
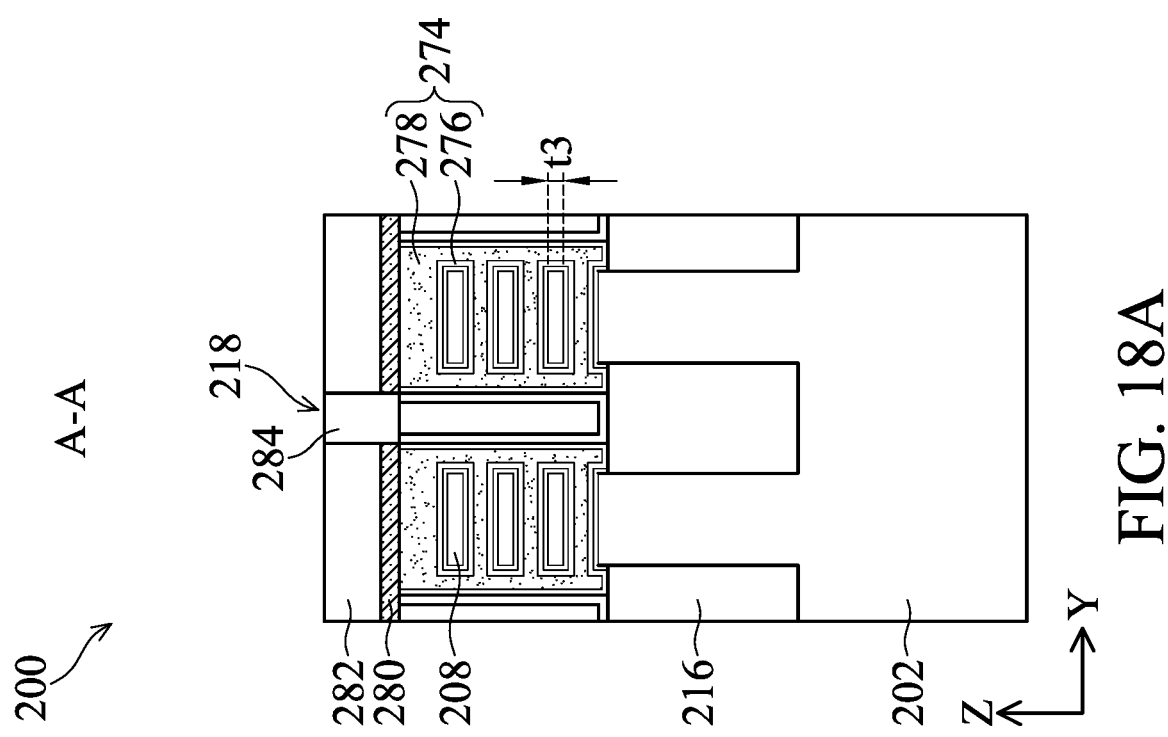

GATE ALL AROUND DEVICE AND METHOD OF FORMING THE SAME

CROSS-REFERENCE TO RELATED APPLICATION

This application claims the benefit of U.S. Provisional Application No. 63/219,636, filed Jul. 8, 2021, the entire disclosure of which is incorporated by reference herein.

BACKGROUND

The electronics industry has experienced an ever-increasing demand for smaller and faster electronic devices that are simultaneously able to support a greater number of increasingly complex and sophisticated functions. To meet these demands, there is a continuing trend in the integrated circuit (IC) industry to manufacture low-cost, high-performance, and low-power ICs. Thus far, these goals have been achieved in large part by reducing IC dimensions (for example, minimum IC feature size), thereby improving production efficiency and lowering associated costs. However, such scaling has also increased complexity of the IC manufacturing processes. Thus, realizing continued advances in IC devices and their performance requires similar advances in IC manufacturing processes and technology.

Recently, multigate devices have been introduced to improve gate control. Multigate devices have been observed to increase gate-channel coupling, reduce OFF-state current, and/or reduce short-channel effects (SCEs). One such multigate device is the gate all around (GAA) device, which includes a gate structure that can extend, partially or fully, around a channel region to provide access to the channel region on at least two sides. GAA devices enable aggressive scaling down of IC technologies, maintaining gate control and mitigating SCEs, while seamlessly integrating with conventional IC manufacturing processes. As GAA devices continue to scale, challenges have arisen with the different channel requirements of NMOS and PMOS devices, which challenges have been observed to degrade performance of the GAA devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 4A, 5A, 6A, 7A, 8A, 9A, 10A, 11A, 12A, 13A, 14A, 15A, 16A, 17A, and 18A are cross-section views of the semiconductor device shown in FIG. 2 taken along line A-A at various fabrication stages according of the method in FIGS. 1A and 1B, according to one or more aspects of the present disclosure.

FIGS. 3B, 4B, 5B, 6B, 7B, 8B, 9B, 10B, 11B, 12B, 13B, 14B, 15B, 16B, 17B, and 18B are cross-section views of the semiconductor device shown in FIG. 2 taken along line B-B at various fabrication stages according of the method in FIGS. 1A and 1B, according to one or more aspects of the present disclosure.

FIGS. 3C, 4C, 5C, 6C, 7C, 8C, 9C, 10C, 11C, 12C, 13C, 14C, 15C, 16C, 17C, and 18C are cross-section views of the semiconductor device shown in FIG. 2 taken along line C-C at various fabrication stages according of the method in FIGS. 1A and 1B, according to one or more aspects of the present disclosure.

FIGS. 3D, 4D, 5D, 6D, 7D, 8D, 9D, 10D, 11D, 12D, 13D, 14D, 15D, 16D, 17D, and 18D are cross-section views of the semiconductor device shown in FIG. 2 taken along line D-D at various fabrication stages according of the method in FIGS. 1A and 1B, according to one or more aspects of the present disclosure.

DETAILED DESCRIPTION

Figure 1A:
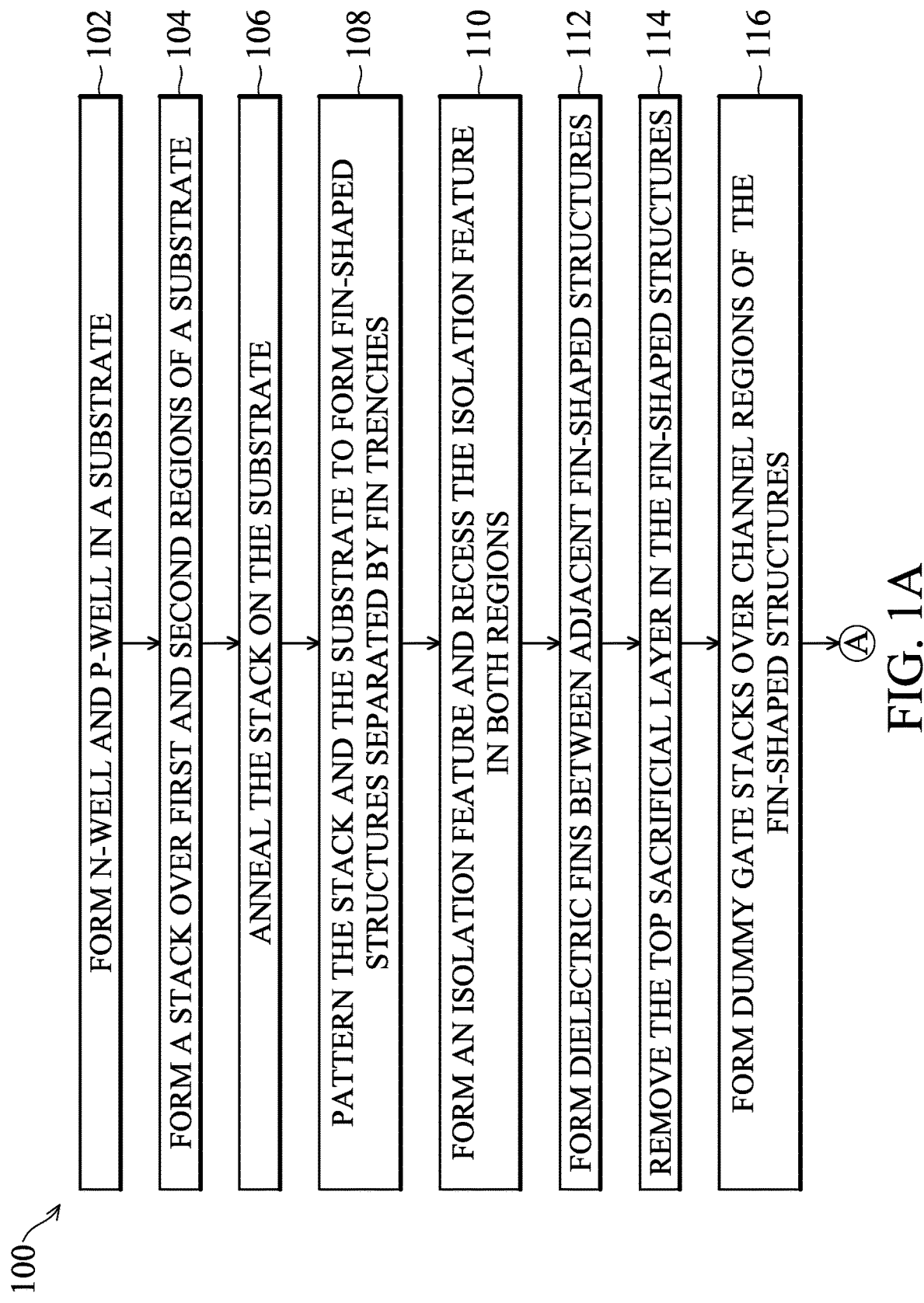
FIGS. 1A and 1B illustrate a flowchart of an example method for making a semiconductor device, according to one or more aspects of the present disclosure.

The present disclosure relates generally to integrated circuit devices, and more particularly, to multigate devices, such as gate-all-around (GAA) devices.

The following disclosure provides many different embodiments, or examples, for implementing different features. Reference numerals and/or letters may be repeated in the various examples described herein. This repetition is for the purpose of simplicity and clarity and does not in itself dictate a relationship between the various disclosed embodiments and/or configurations. Further, specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature on, connected to, and/or coupled to another feature in the present disclosure may include embodiments in which the features are formed in direct contact, and may also include embodiments in which additional features may be formed interposing the features, such that the features may not be in direct contact.

Further, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used herein for ease of description to describe one element or feature's relationship to another element(s) or feature(s). The spatially relative terms are intended to encompass different orientations than as depicted of a device (or system or apparatus) including the element(s) or feature(s), including orientations associated with the device's use or operation. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to integrated circuit (IC) chips having transistors with channel members in different regions having different thickness to improve overall performance. In various embodiments, gate all around (GAA) transistors with different channel member thicknesses on the same substrate are placed in a first region (e.g., an NMOS transistor(s)) and a second region (e.g., PMOS transistor(s)) inside one IC chip.

The first region and second region may be directly adjacent one another. The different thicknesses of channel members can be achieved by implanting different dopants in the first region and second region and performing an etching process, according to various aspects of the present disclosure. Although embodiments that include stacked semiconductor channel layers in forms of nanowires or nanosheets are illustrated as channel members in the figures, the present disclosure is not so limited and may be applicable to other multi-gate devices, such as other types of GAA transistors or FinFETs.

Figure 1B:
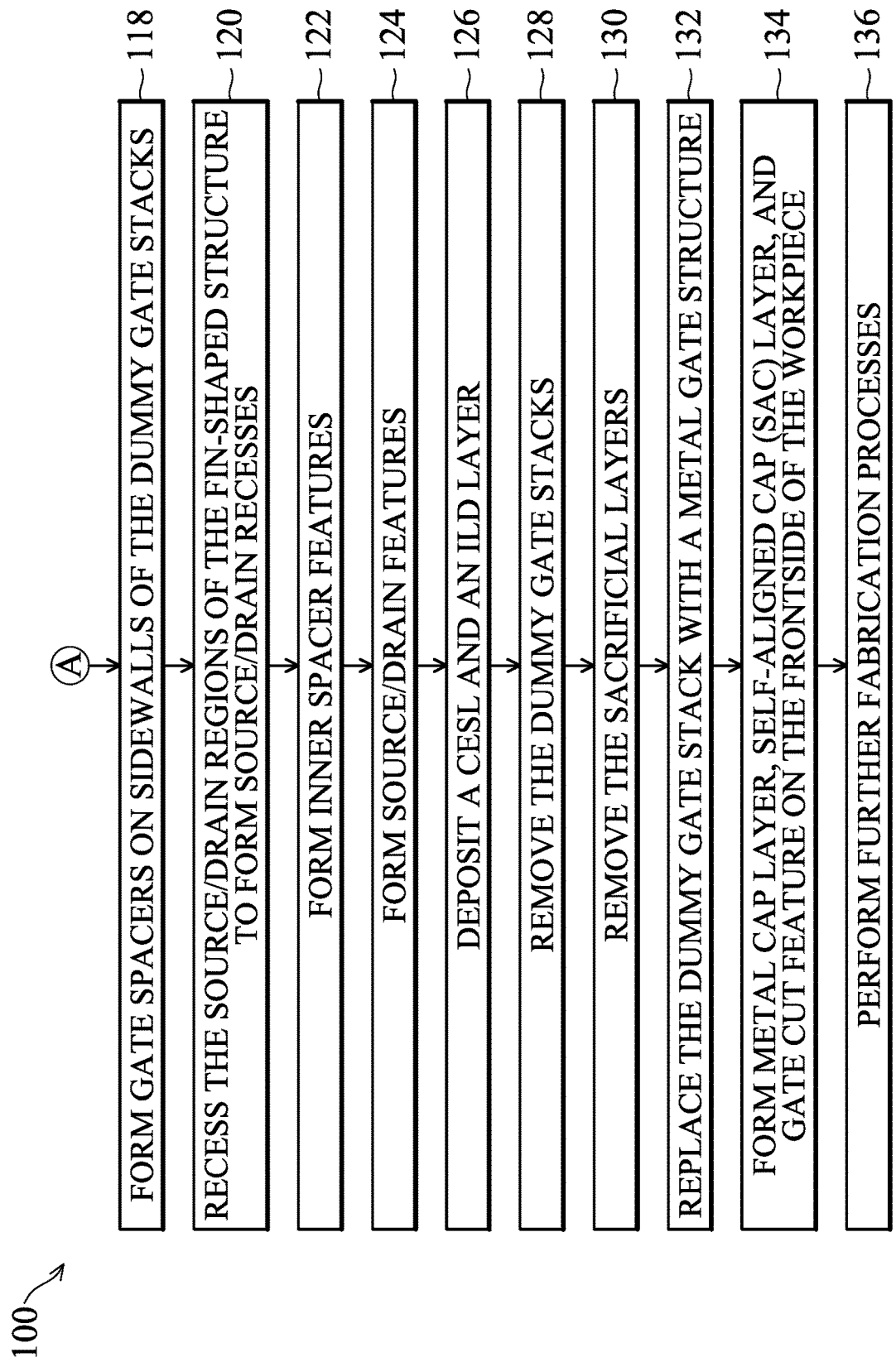

The various aspects of the present disclosure will now be described in more detail with reference to the figures. FIGS. 1A and 1B collectively illustrate a flowchart of a method 100 of forming a semiconductor device. The method 100 is merely an example and is not intended to limit the present disclosure to what is explicitly illustrated in the method 100. Additional steps may be provided before, during and after the method 100, and some steps described can be replaced, eliminated, or moved around for additional embodiments of the method. Not all steps are described herein in detail for reasons of simplicity. The method 100 is described below in conjunction with FIGS. 2-18D, which illustrate fragmentary perspective views and cross-sectional views of a workpiece 200 at different stages of fabrication according to embodiments of the method 100. Because a semiconductor device will be formed from the workpiece 200, the workpiece 200 may be referred to as a semiconductor device 200 or a device 200 as the context requires.

In some embodiments, the workpiece 200 is a portion of an IC chip, a system on a chip (SoC), or portion thereof, that includes various passive and active microelectronic devices such as resistors, capacitors, inductors, diodes, p-type field effect transistors (PFETs), n-type field effect transistors (NFETs), FinFETs, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, memory devices, other suitable components, or combinations thereof. FIGS. 2-18D have been simplified for the sake of clarity to better understand the inventive concepts of the present disclosure. Additional features can be added in the workpiece 200, and some of the features described below can be replaced, modified, or eliminated in other embodiments of the workpiece 200. The workpiece 200 includes a first region (also denoted as the region I) for NFETs and a second region (also denoted as the region II) for PFETS.

Figure 2:
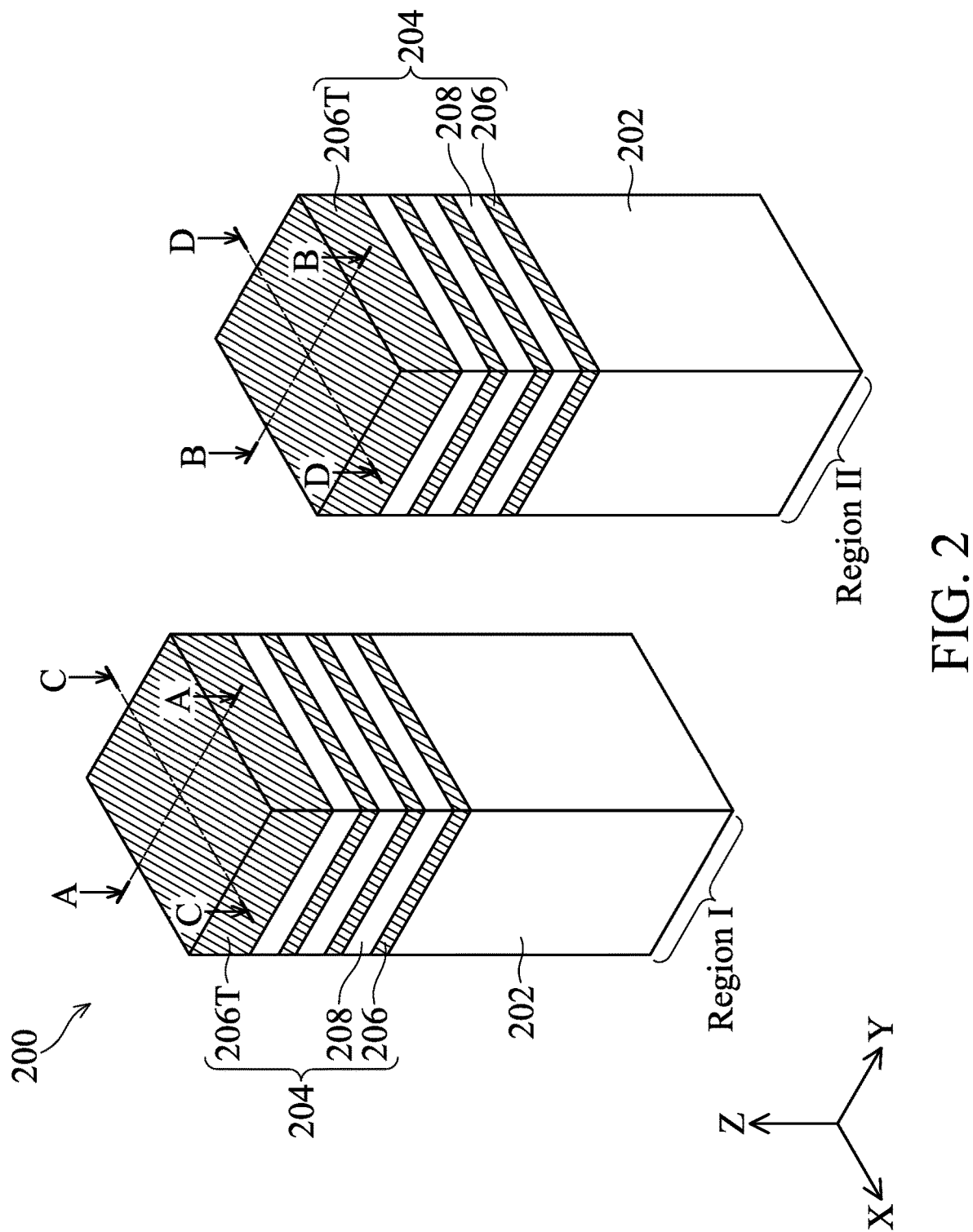
FIG. 2 illustrates a perspective view of a semiconductor device, according to one or more aspects of the present disclosure.
Figure 3B:
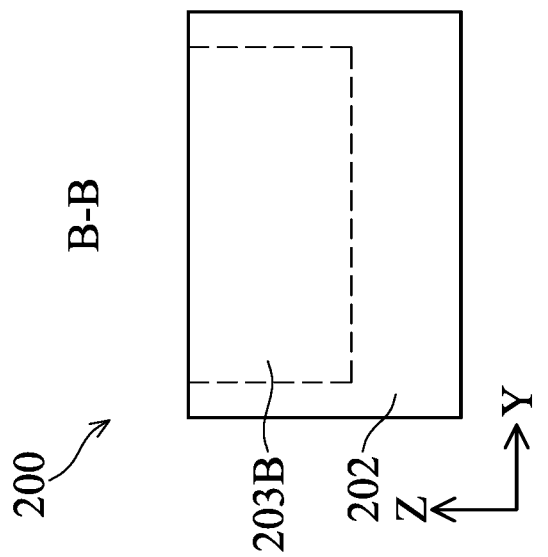
Figure 3A:
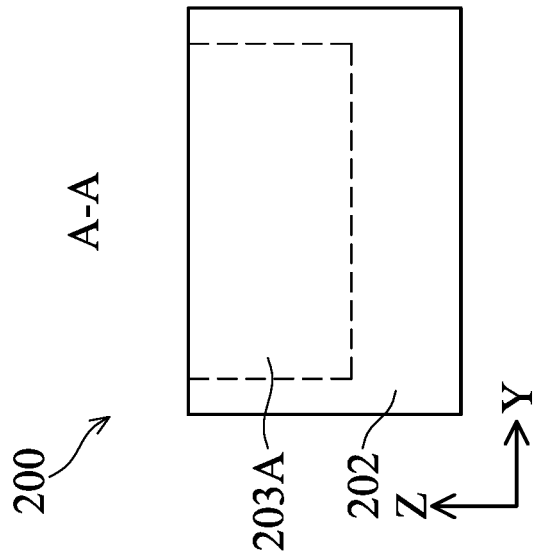
Figure 3D:
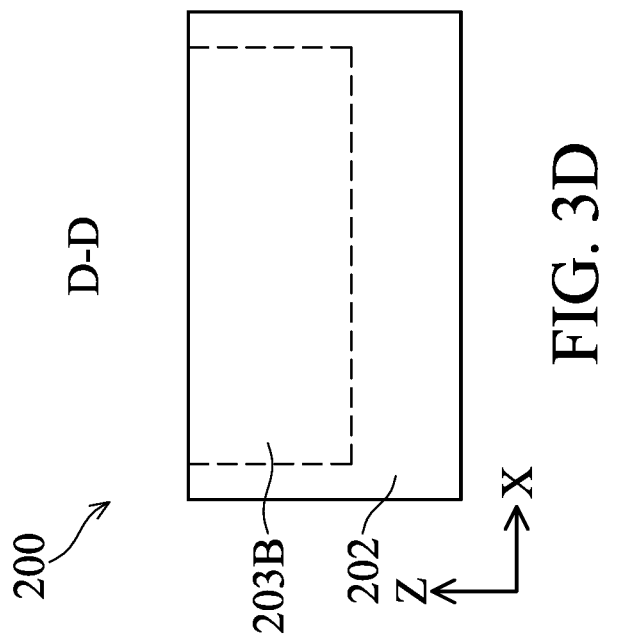
Figure 3C:
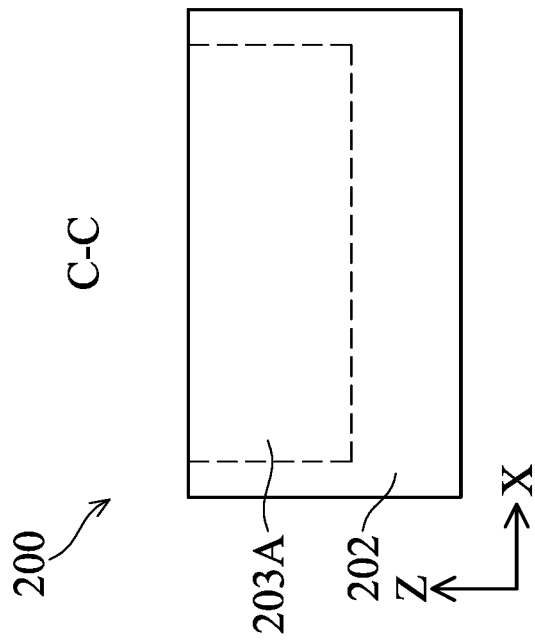
Figure 4B:
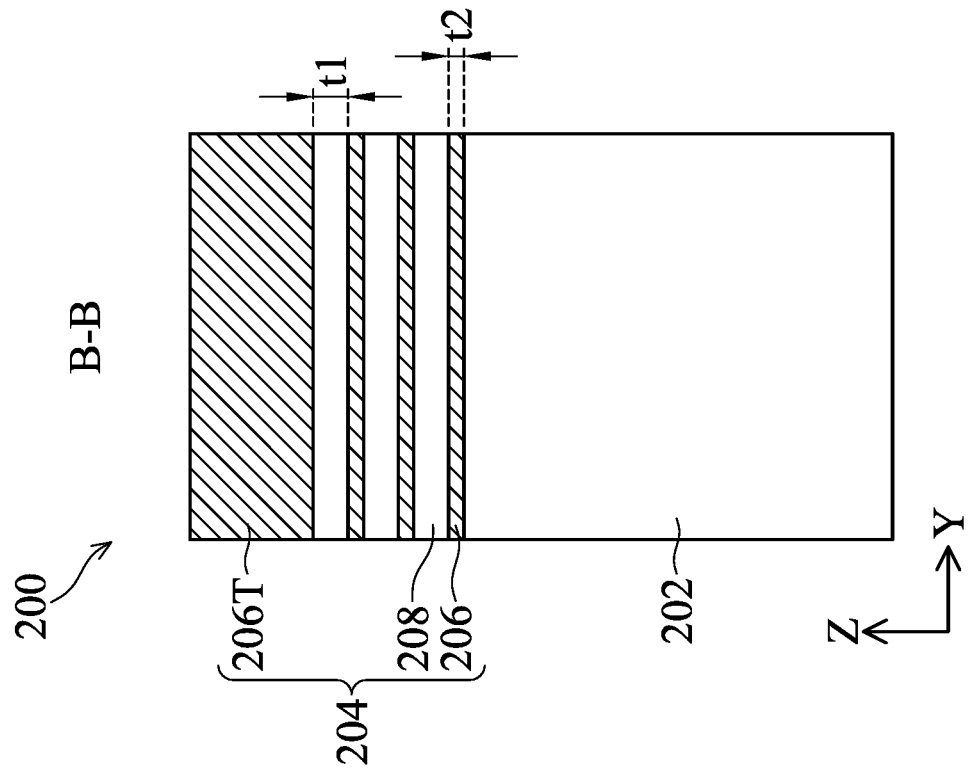
Figure 4A:
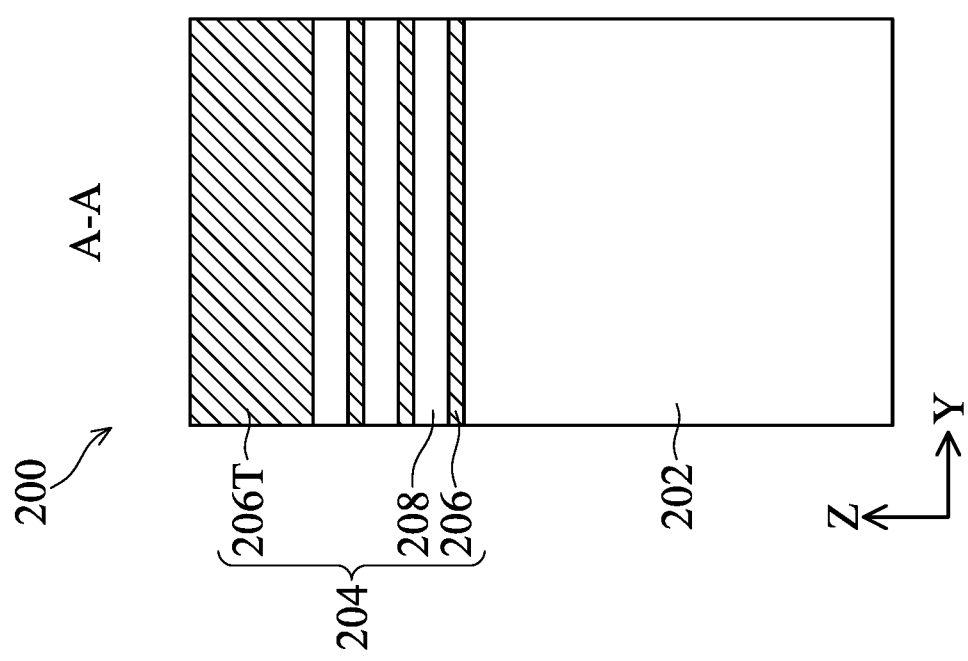
Figure 4D:
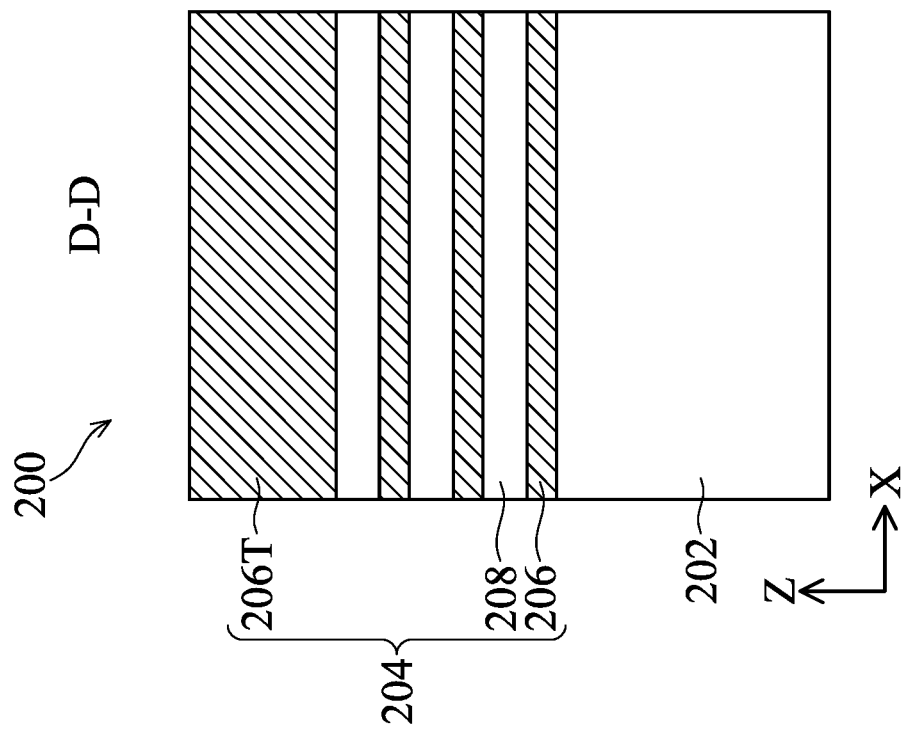
Figure 4C:
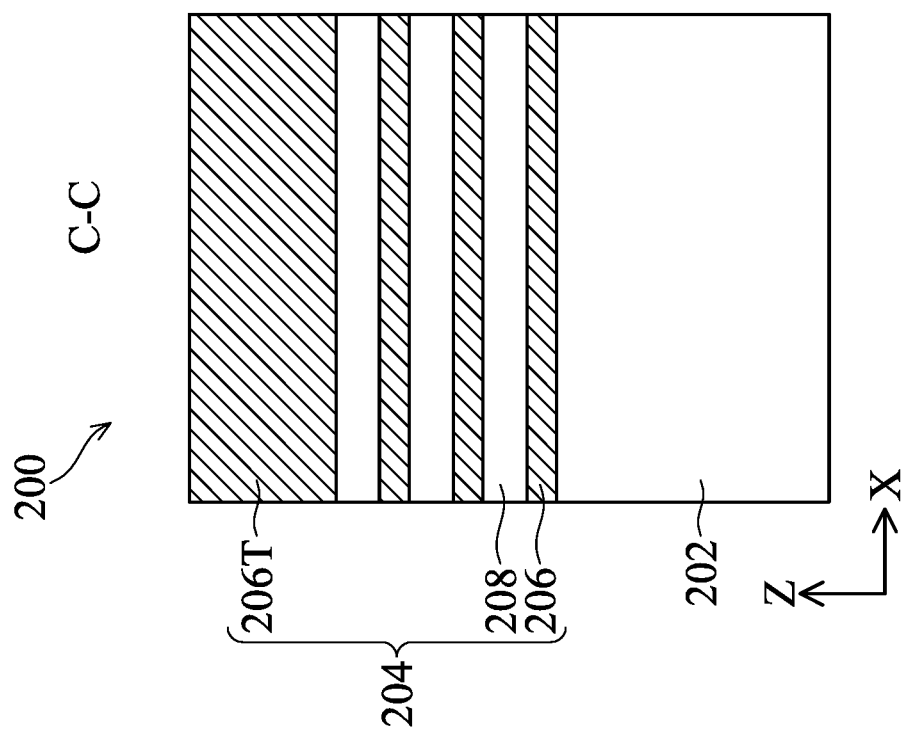
Figure 5A:
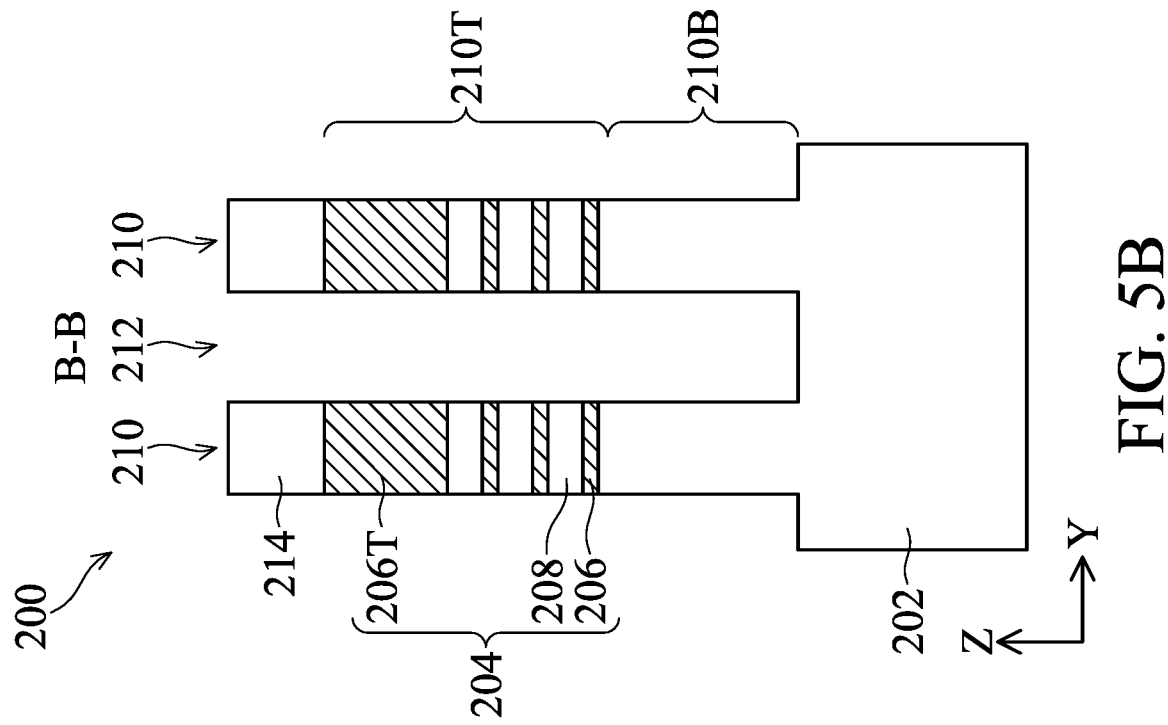
Figure 5B:
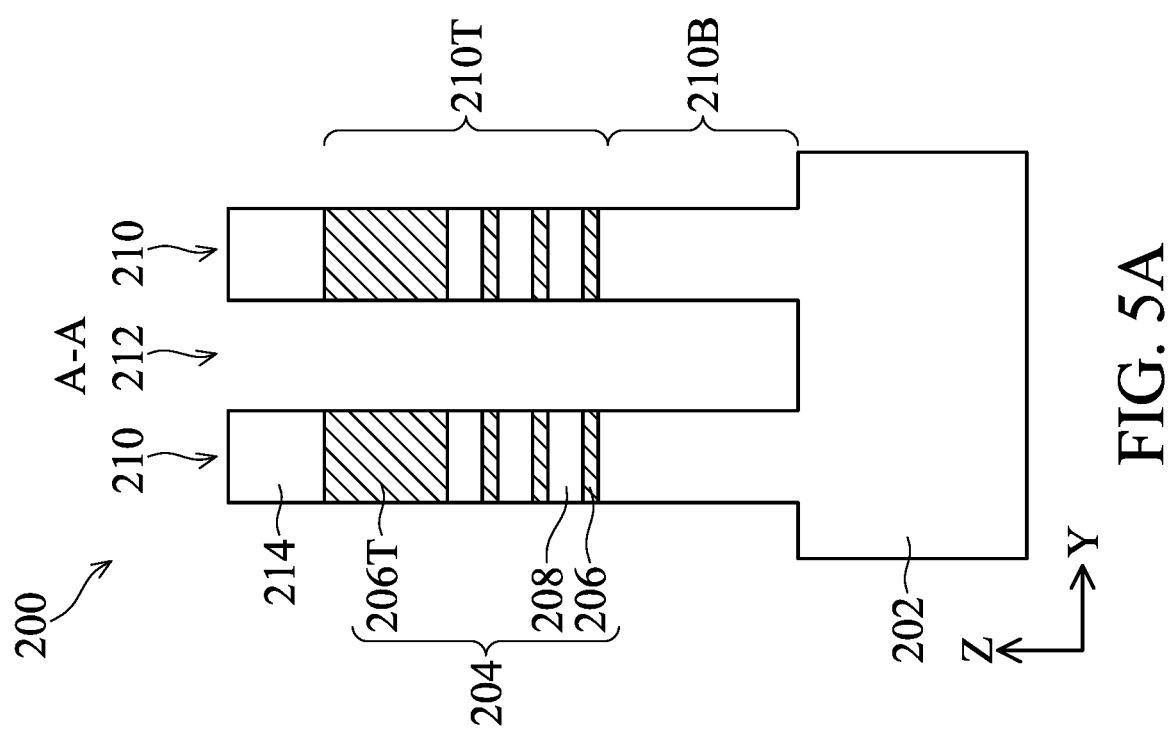
Figure 5D:
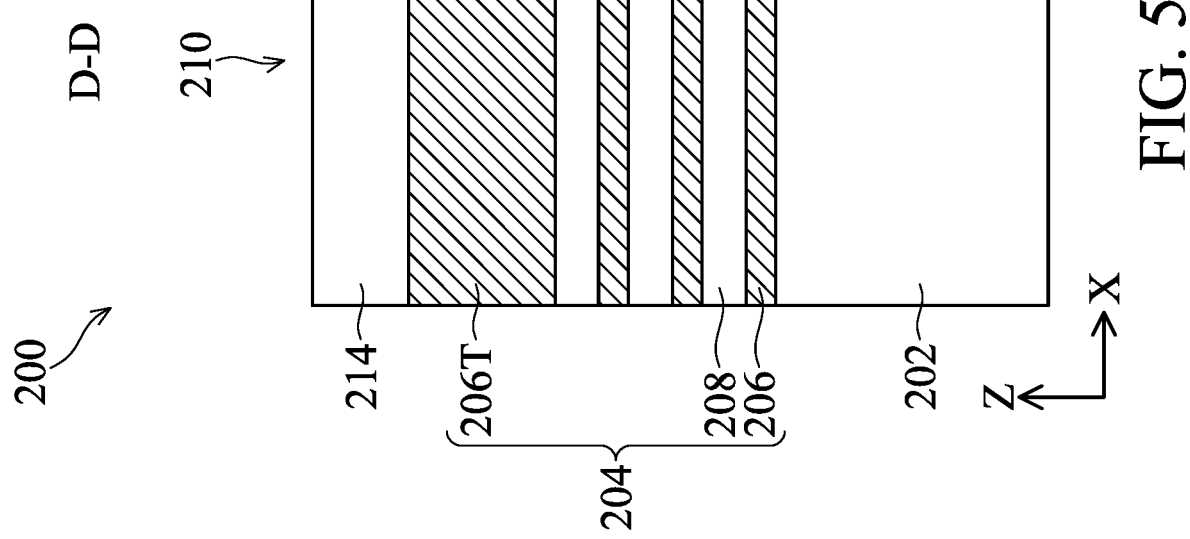
Figure 5C:
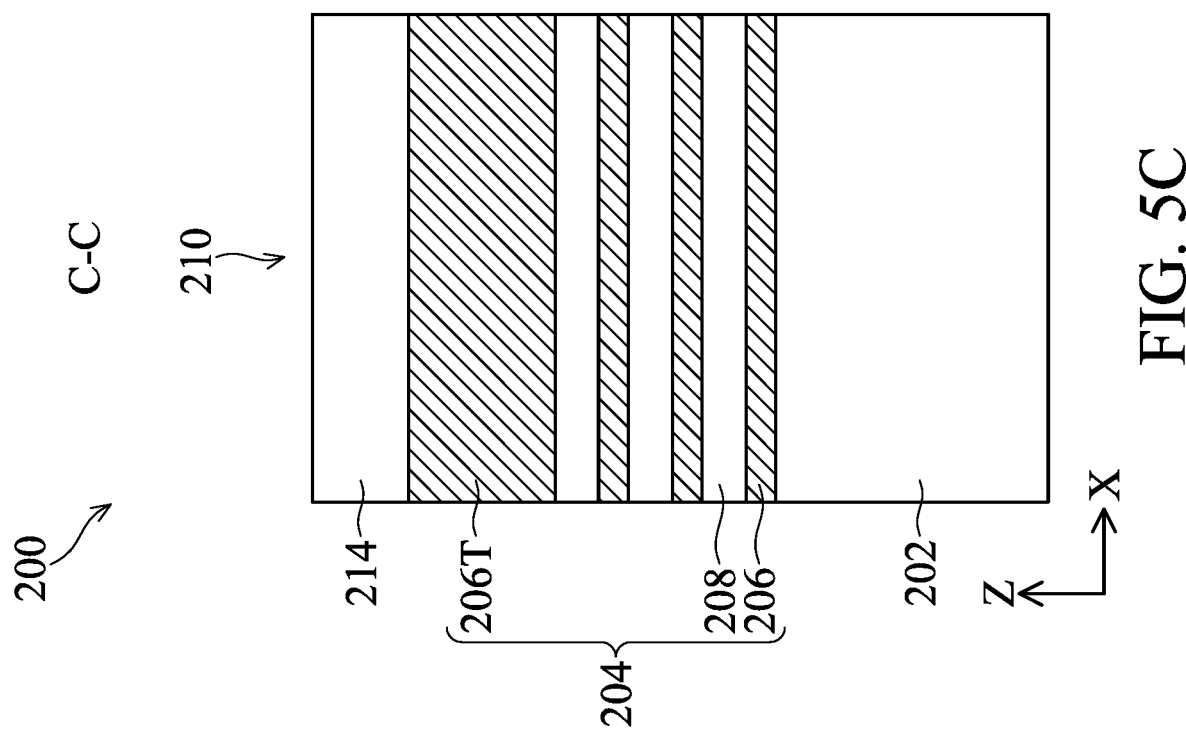
Figure 6C:
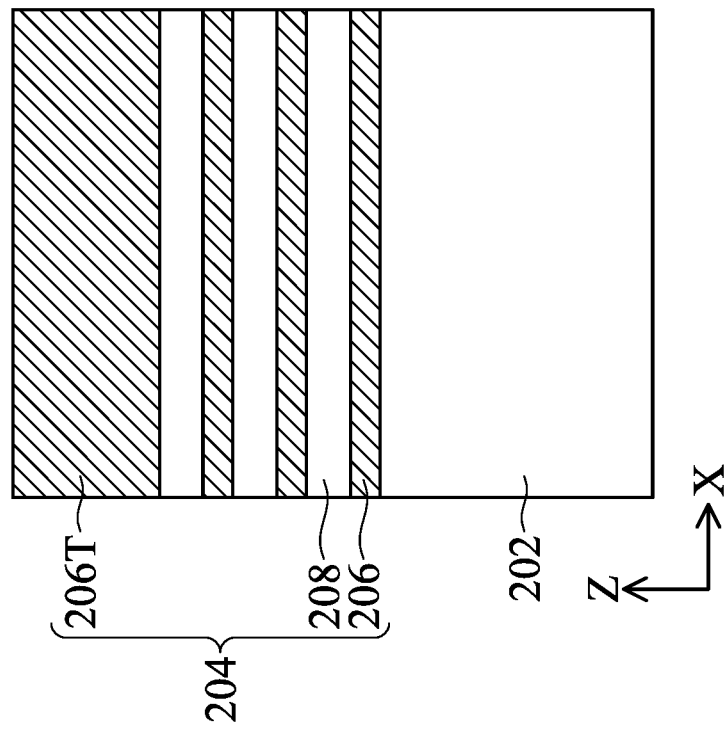
Figure 6D:
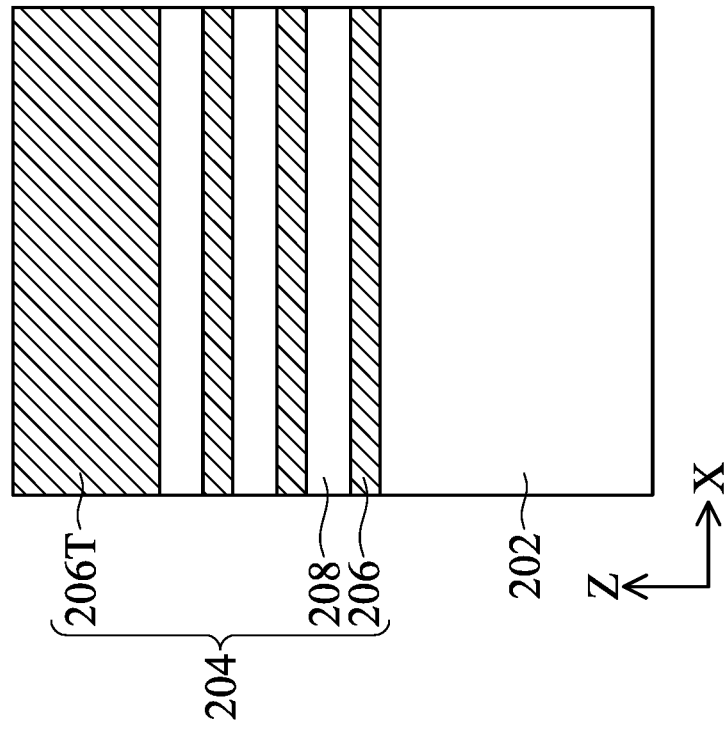
Figure 7D:
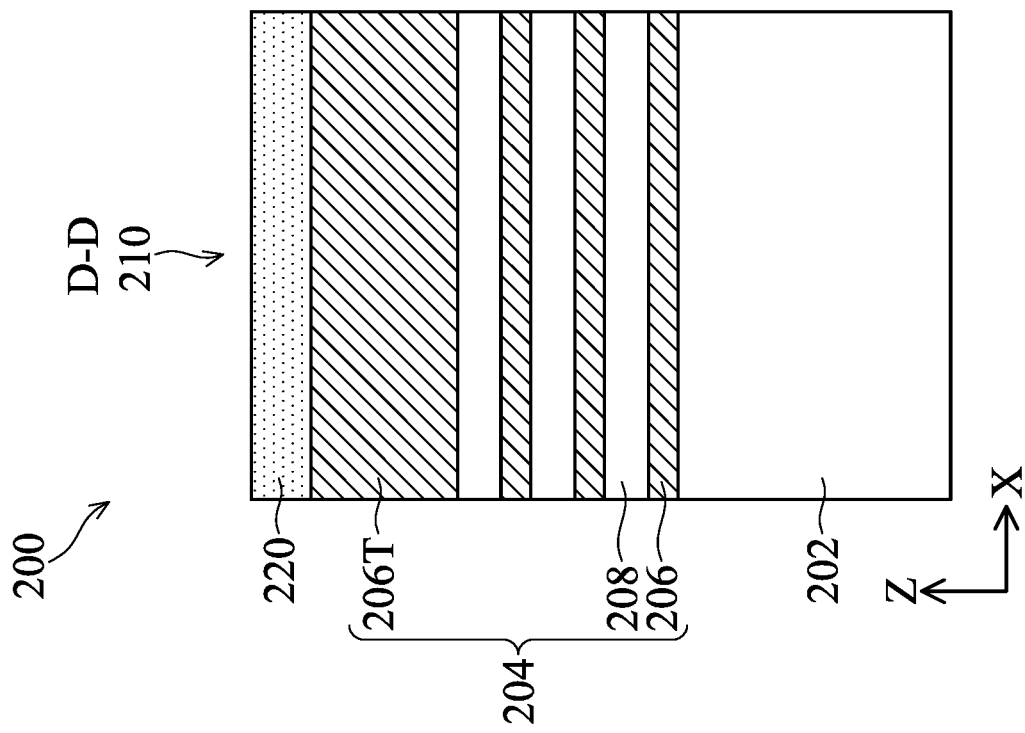
Figure 7C:
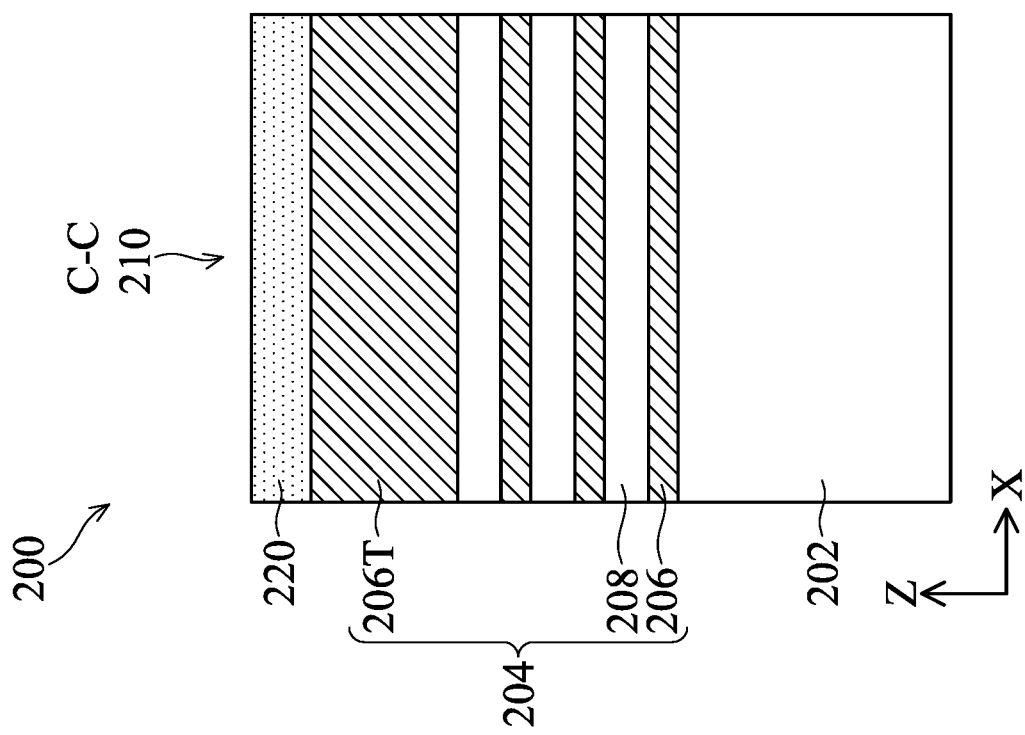
Figure 8B:
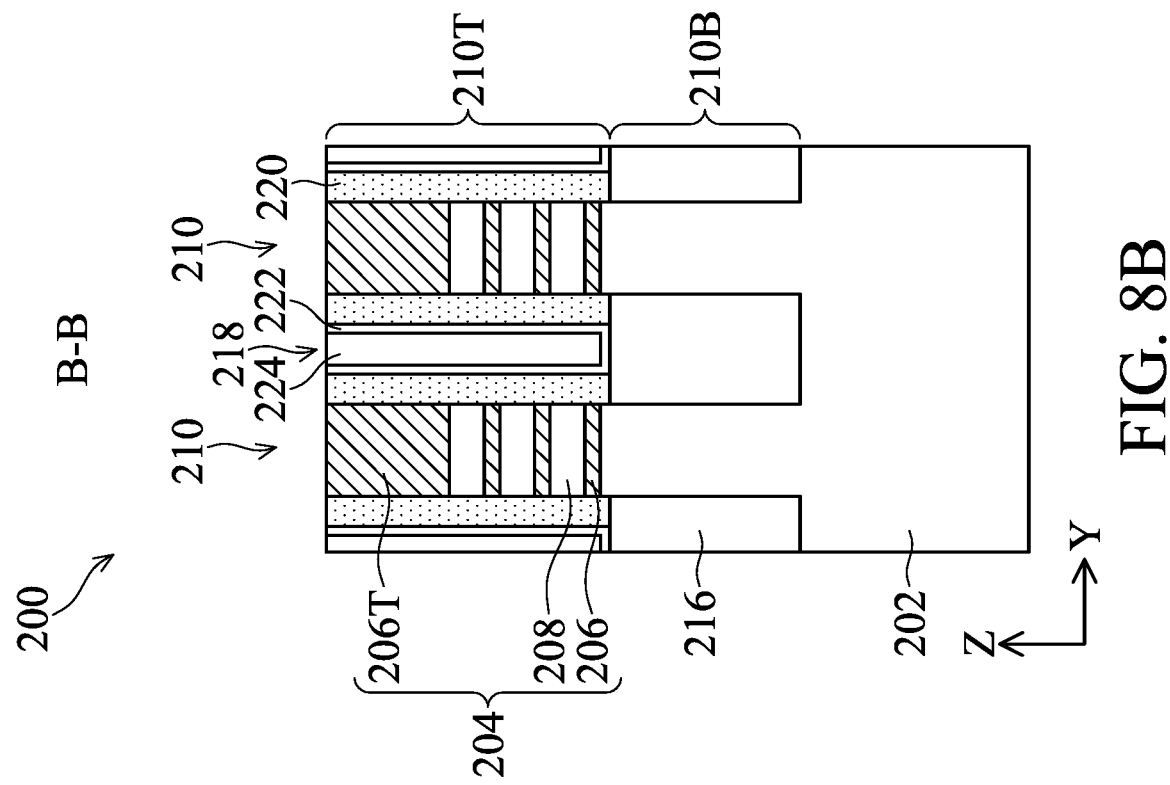
Figure 8A:
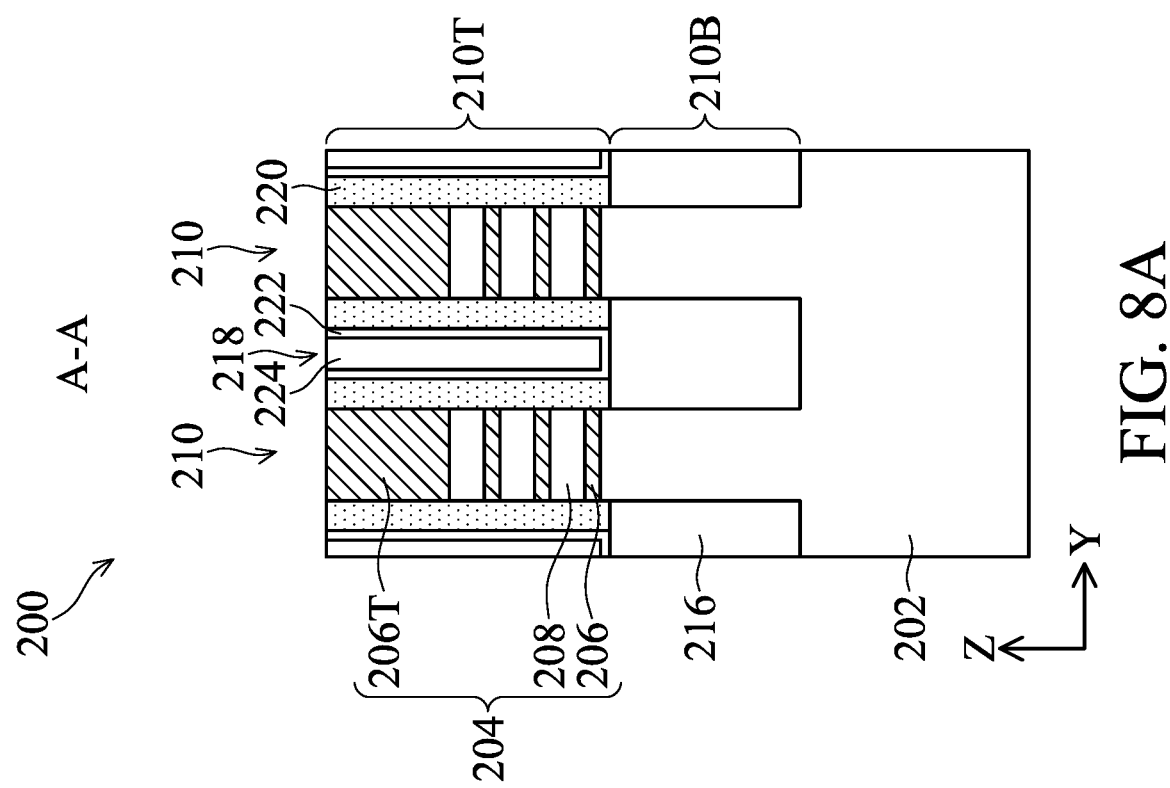
Figure 8D:
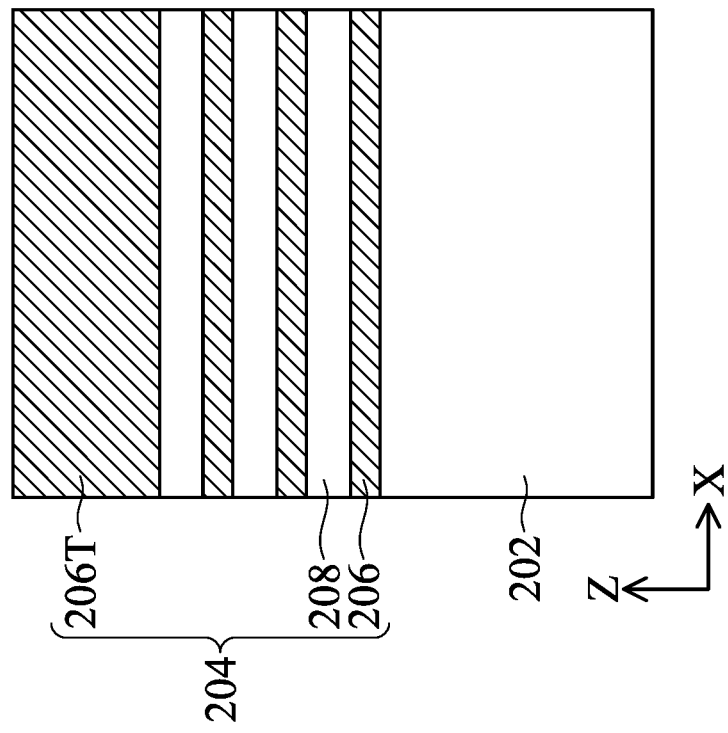
Figure 8C:
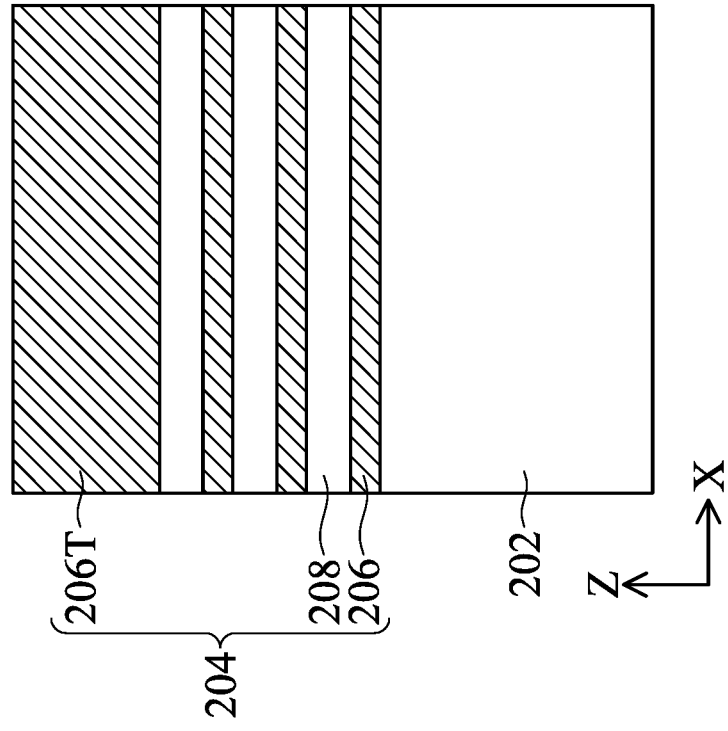
Figure 9A:
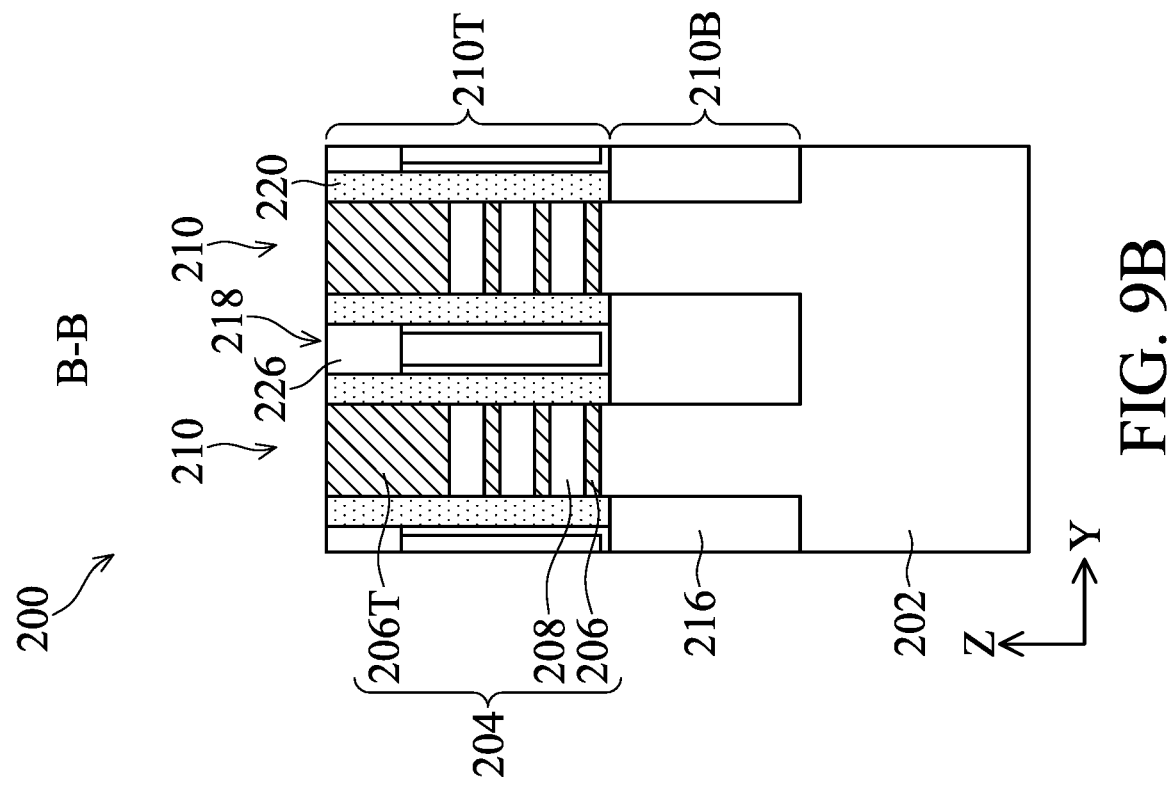
Figure 9B:
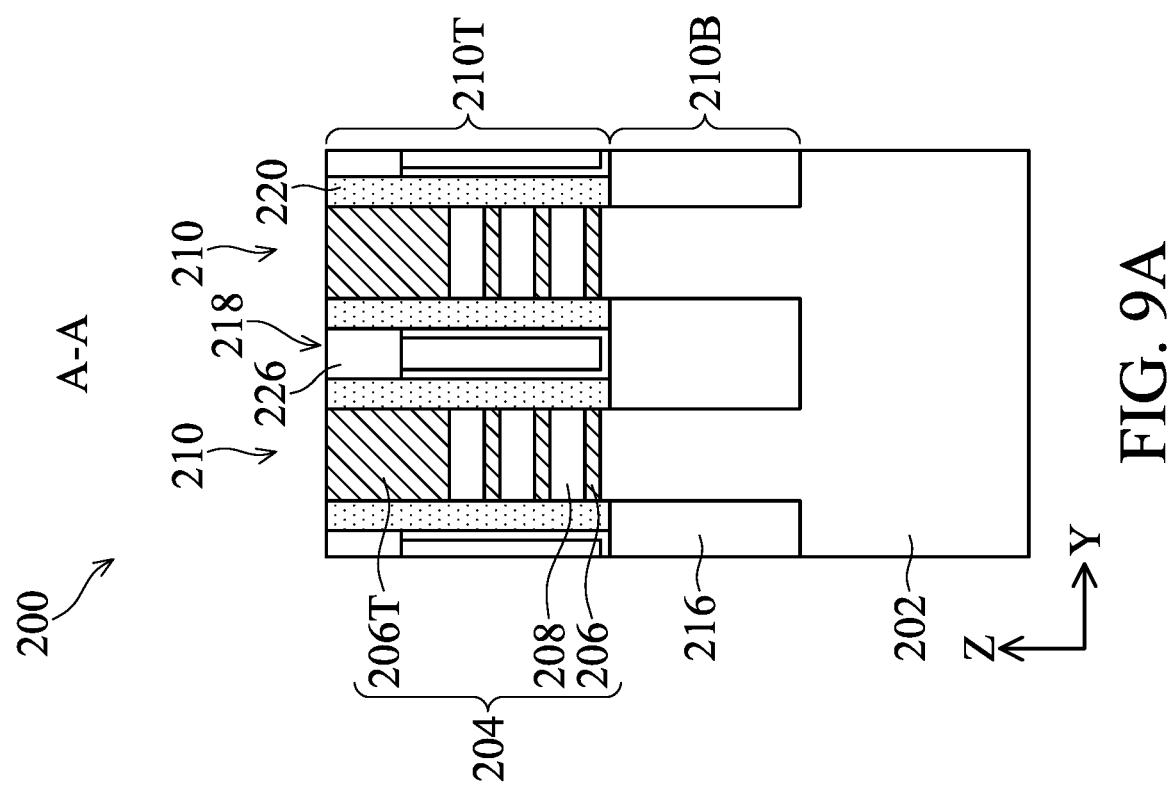
Figure 9D:
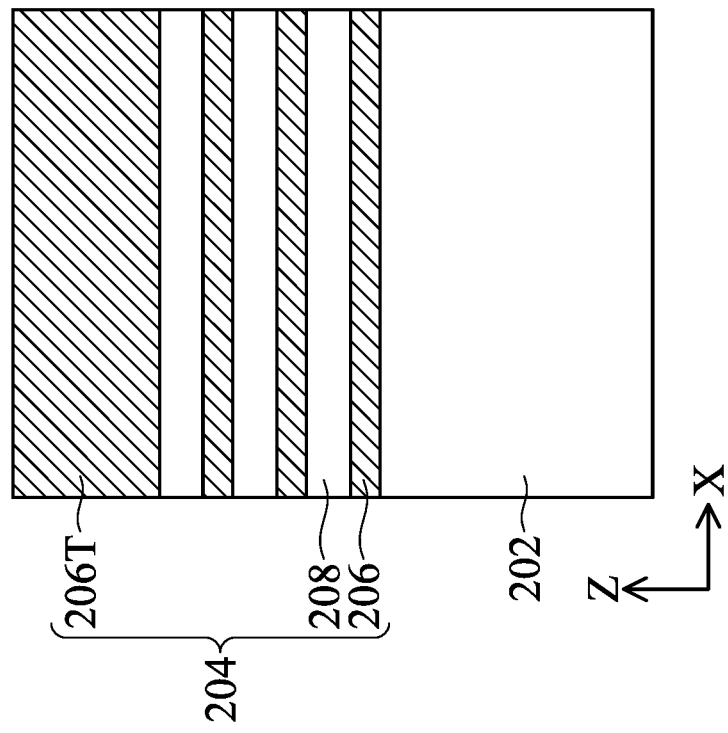
Figure 9C:
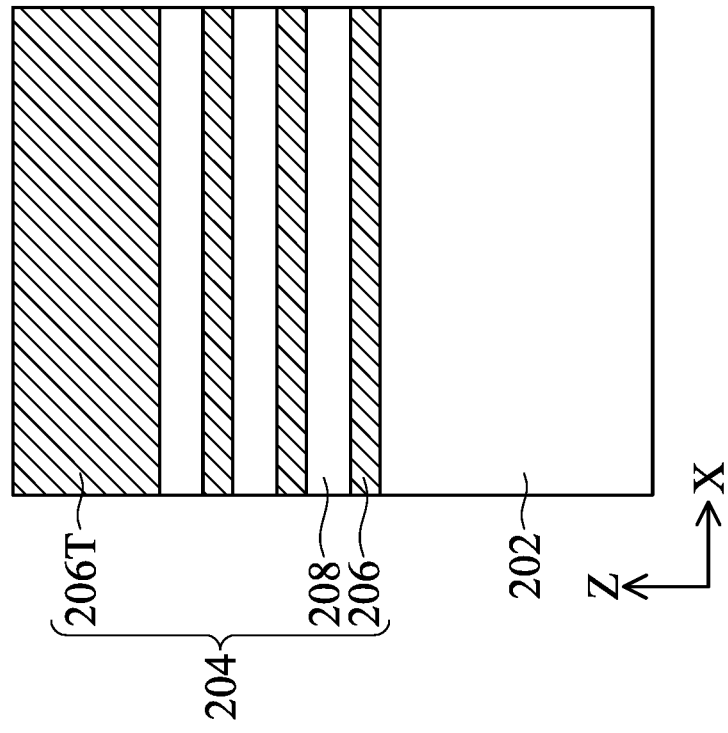
Figure 11B:
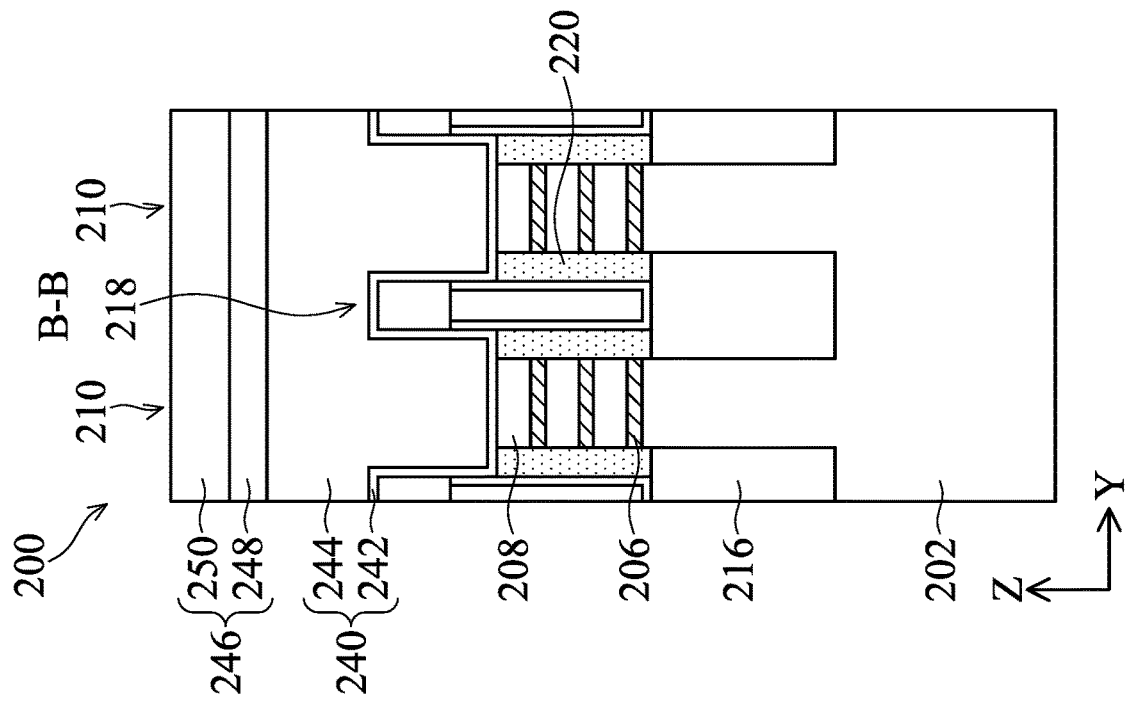
Figure 11A:
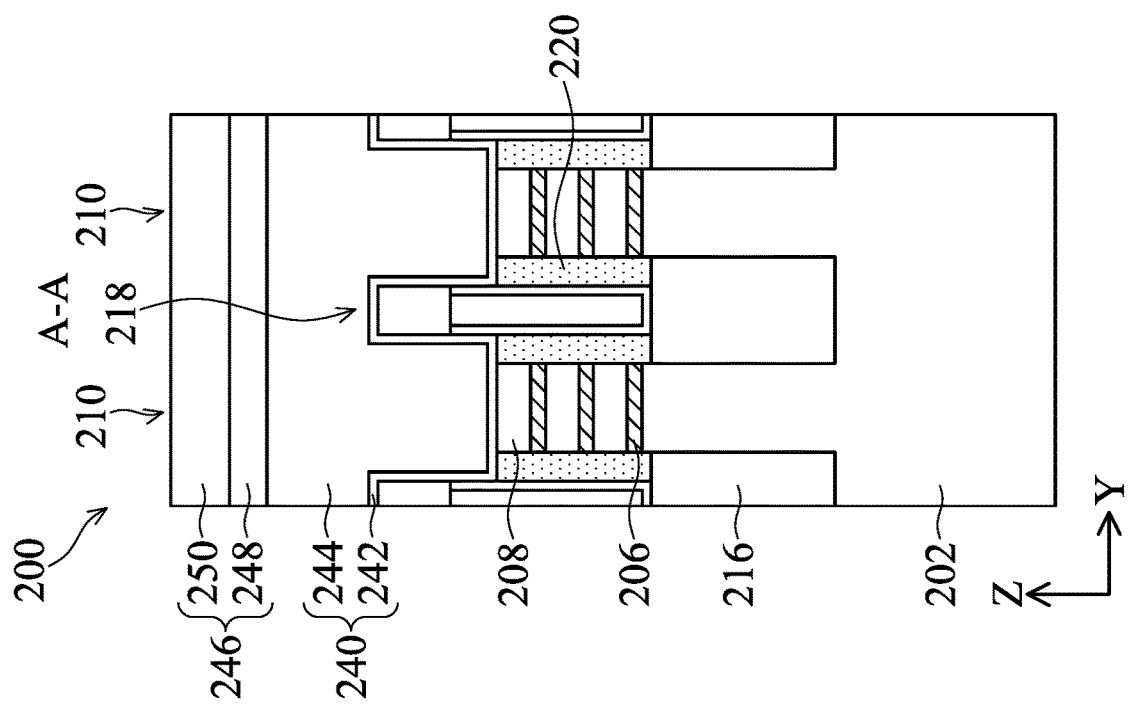
Figure 11D:
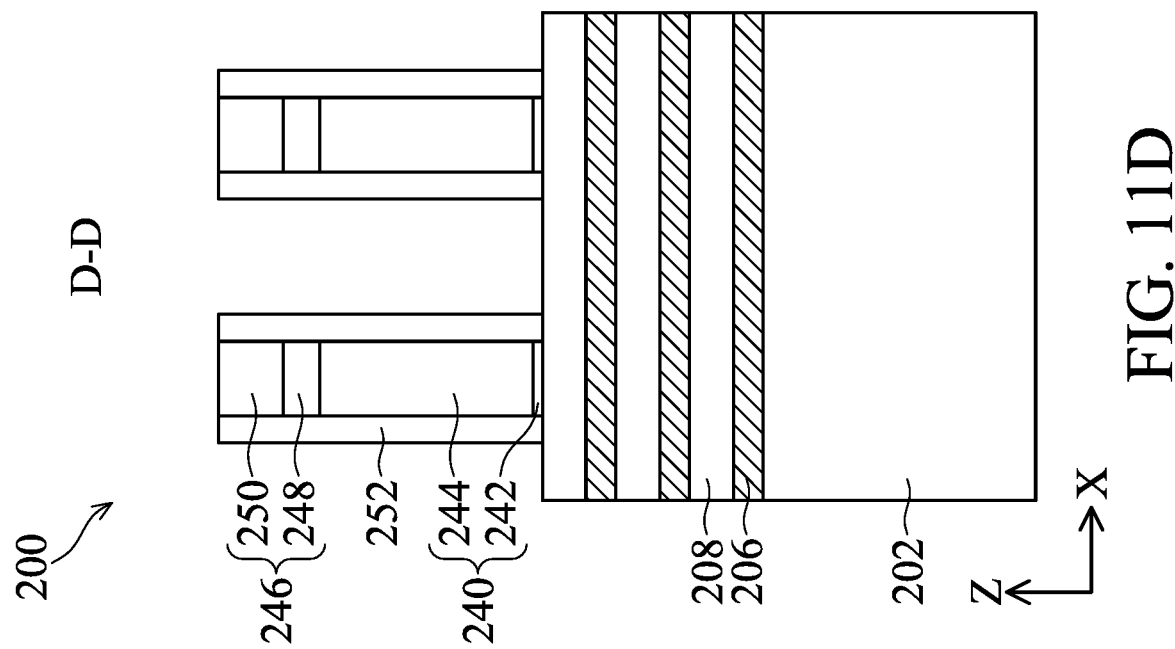
Figure 11C:
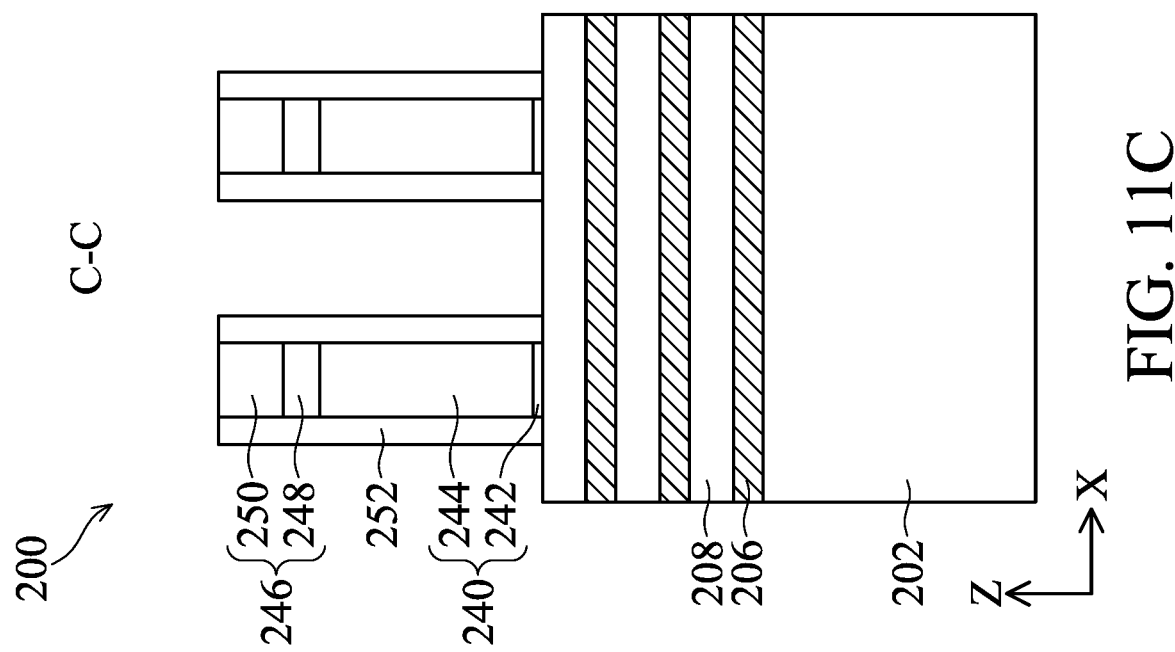
Figure 12A:
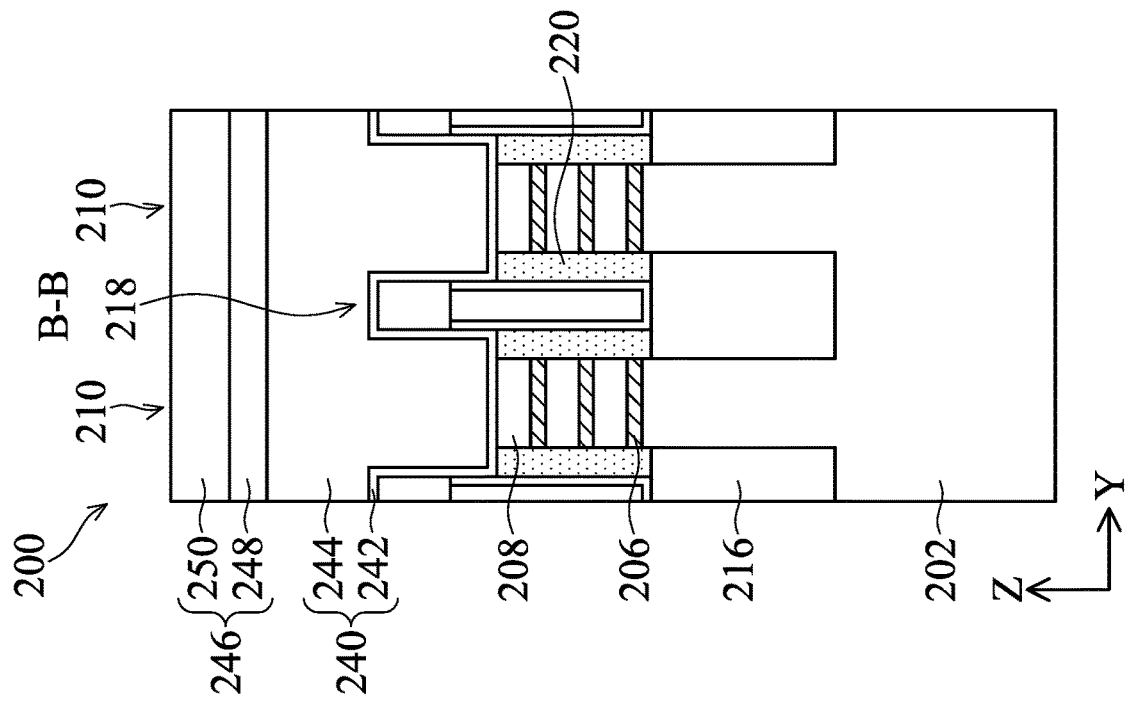
Figure 12B:
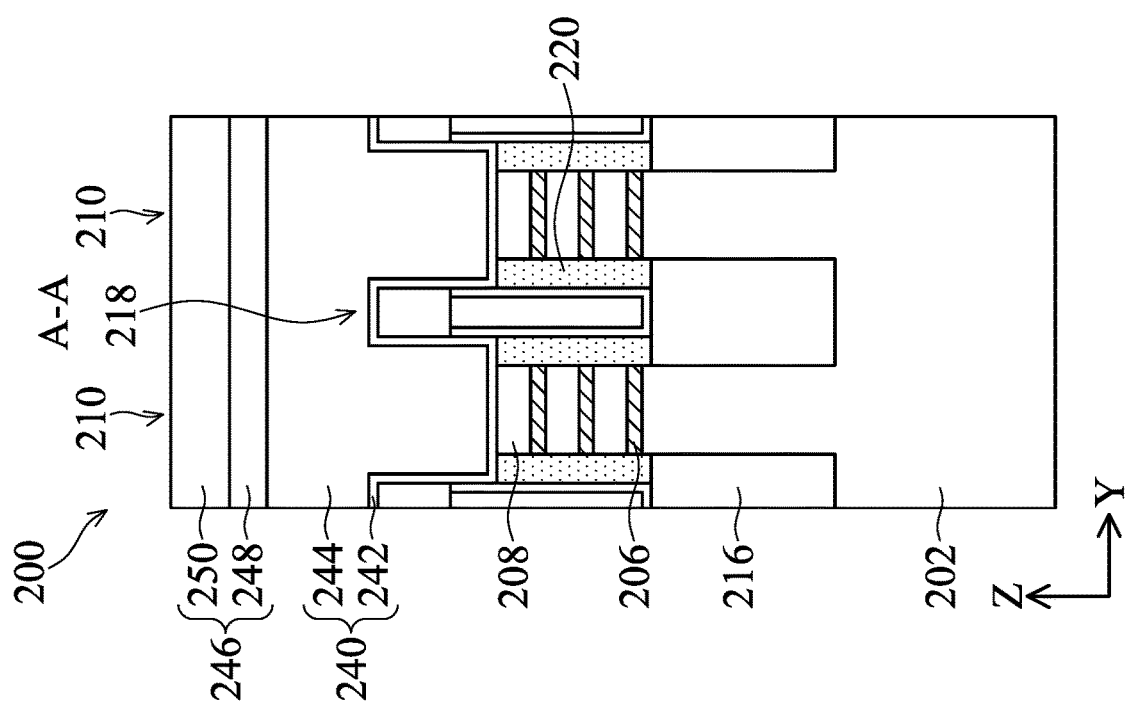
Figure 12D:
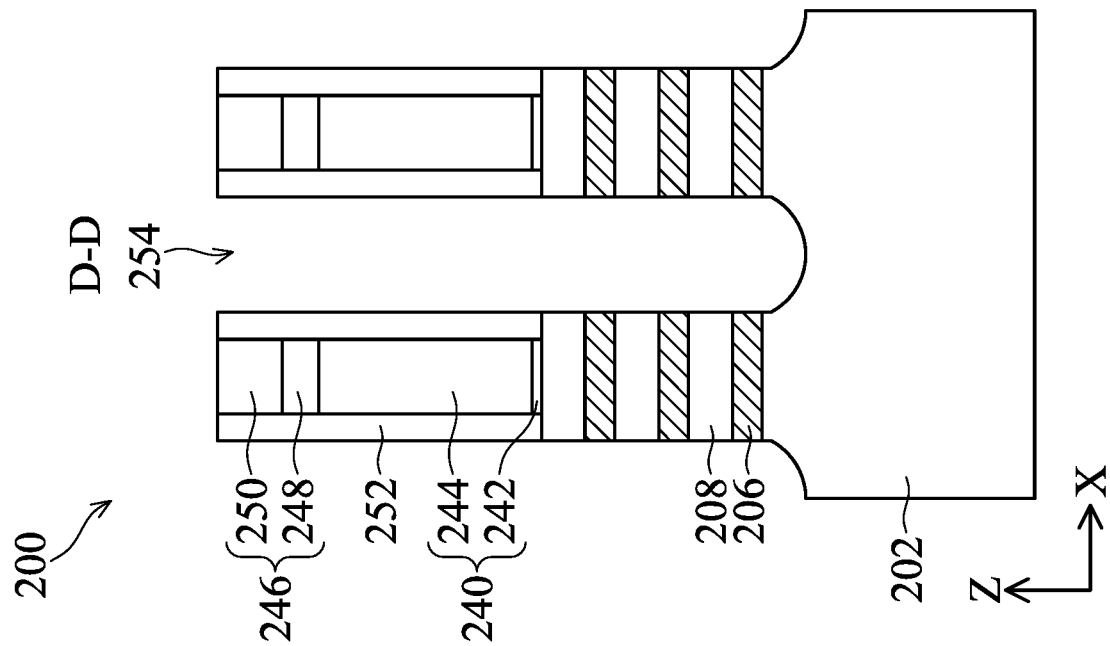
Figure 12C:
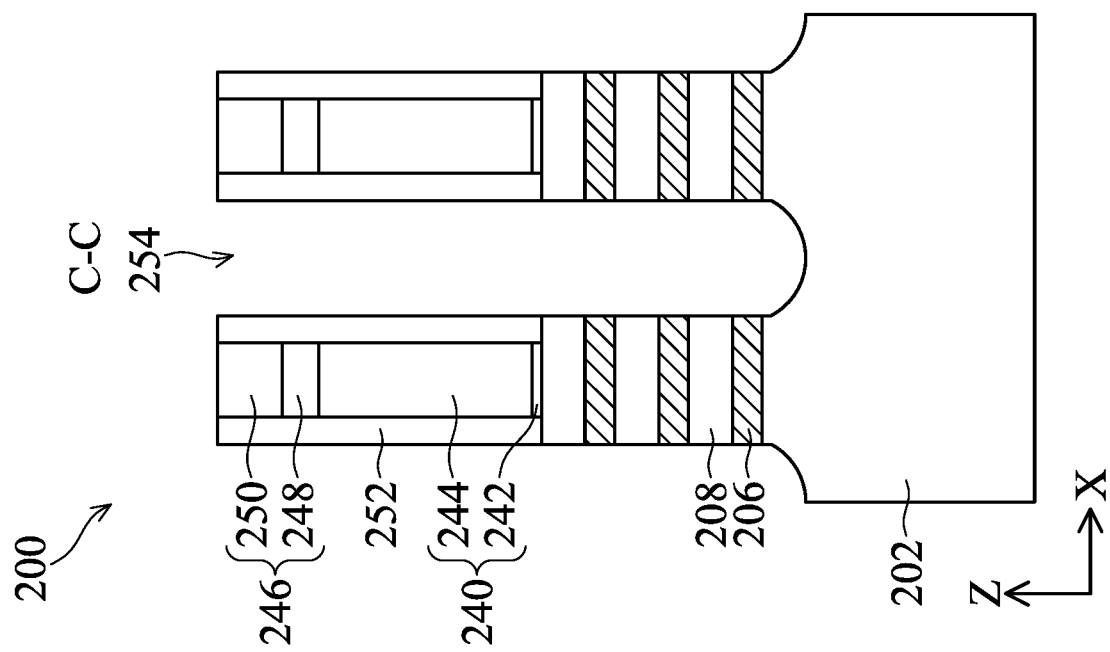
Figure 13A:
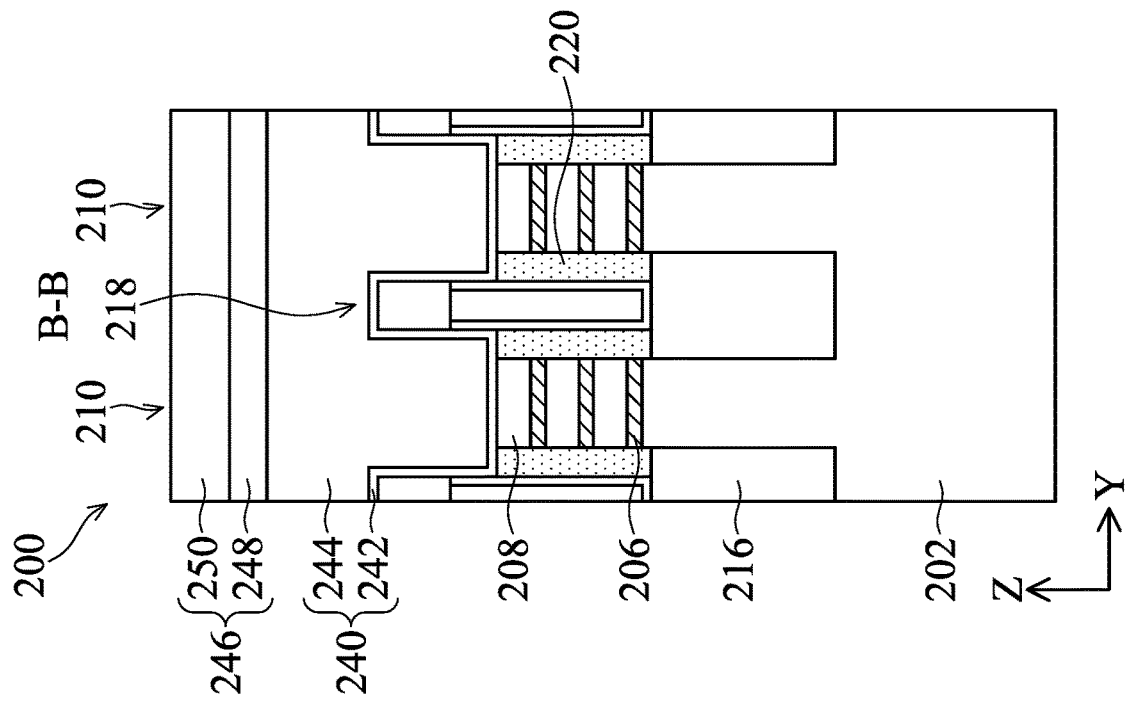
Figure 13B:
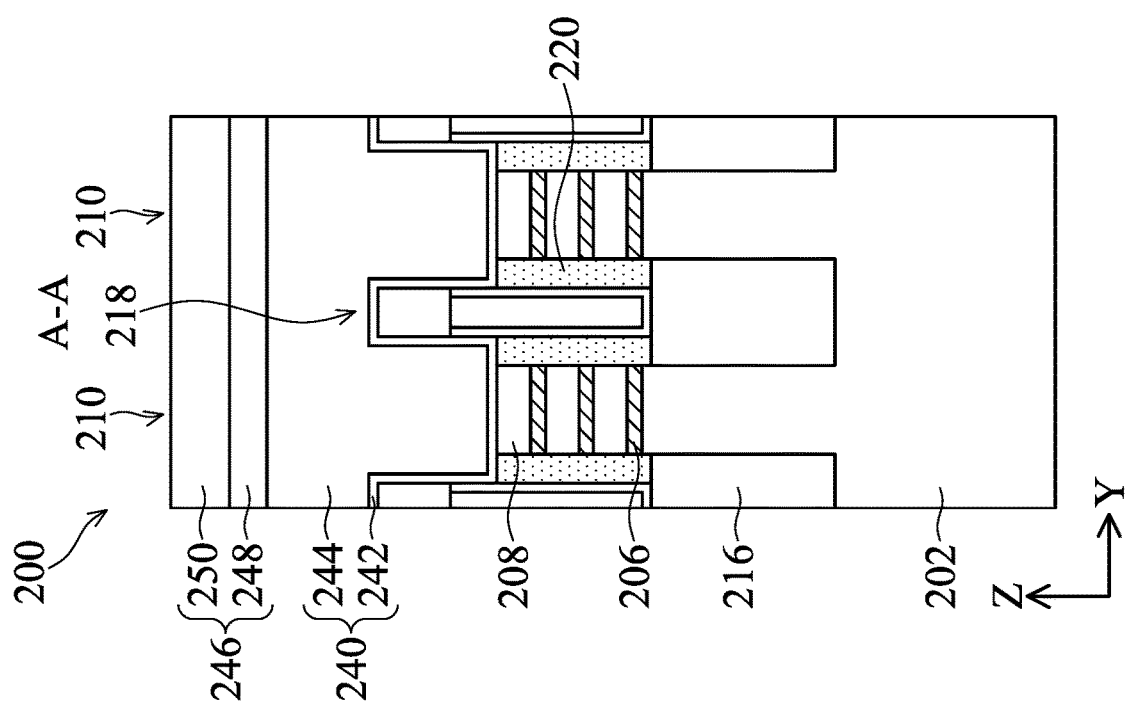
Figure 13C:
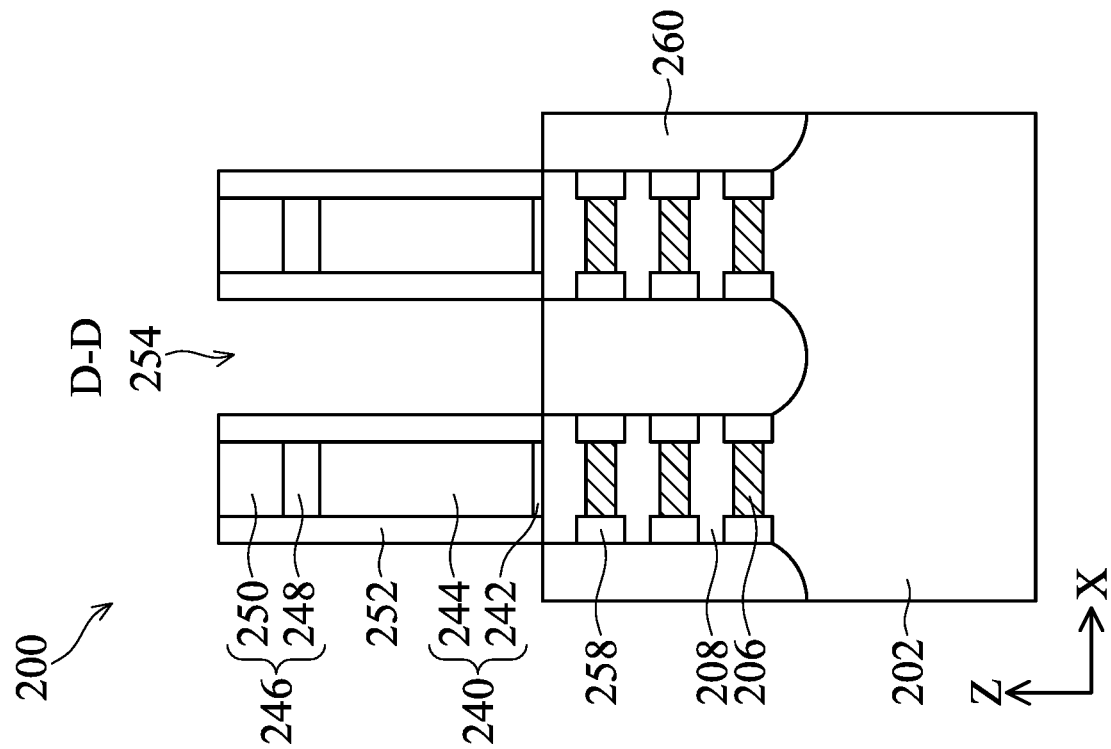
Figure 13D:
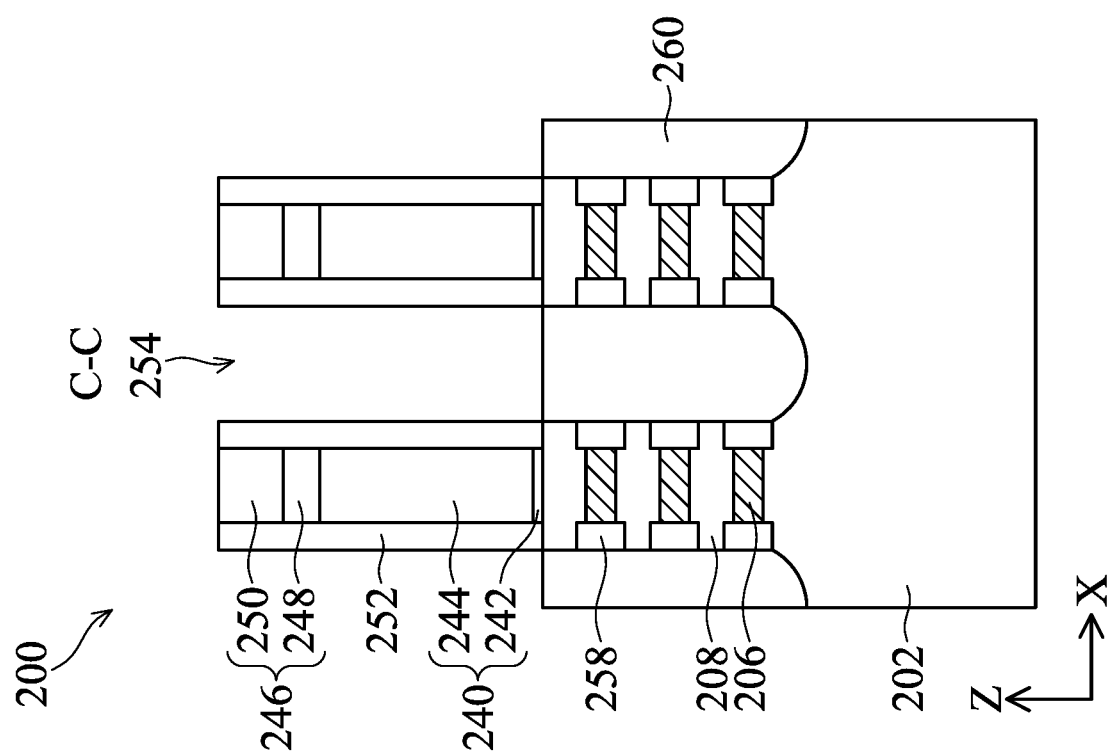
Figure 14B:
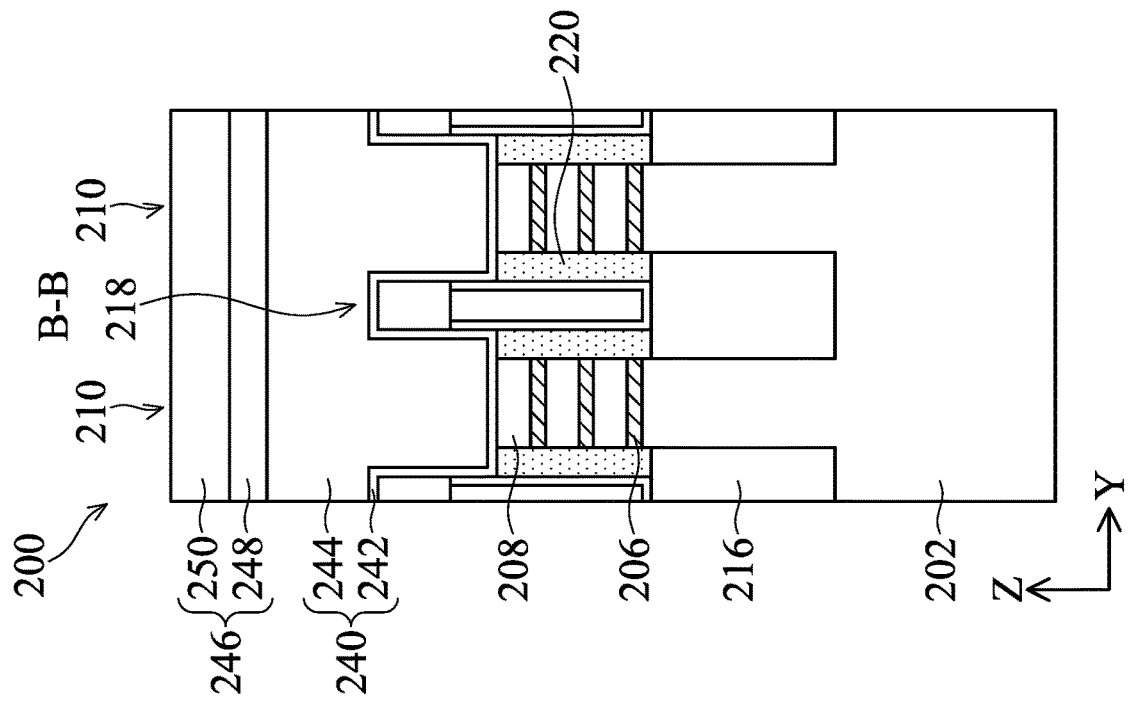
Figure 14A:
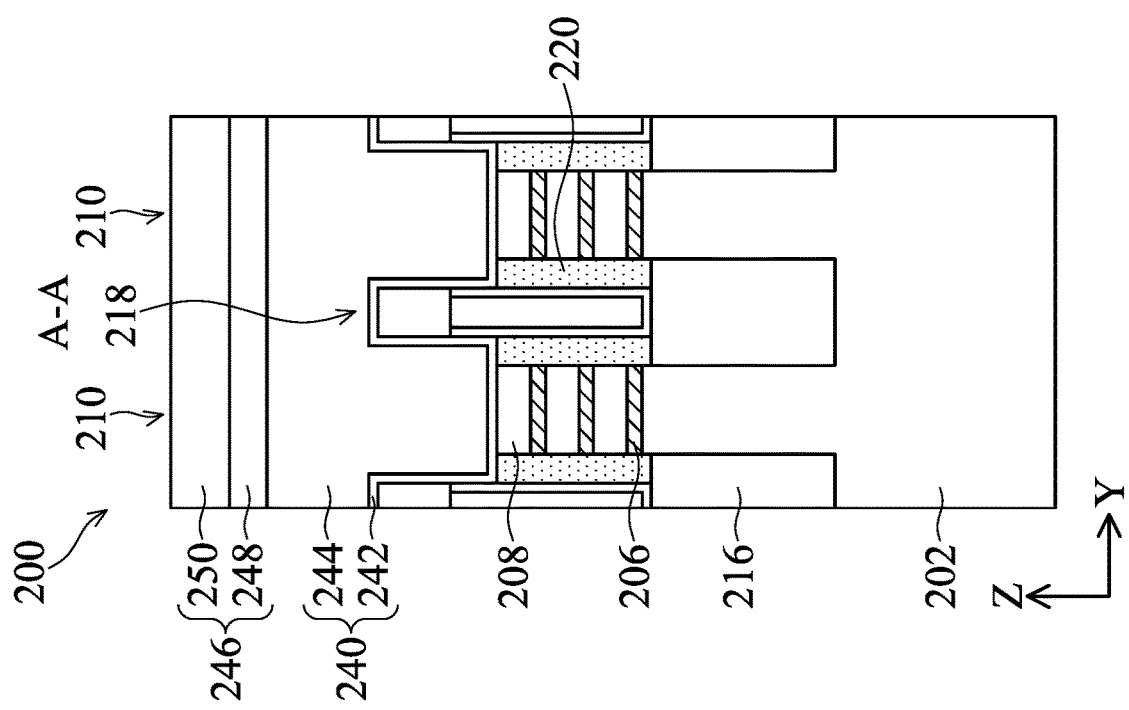
Figure 14D:
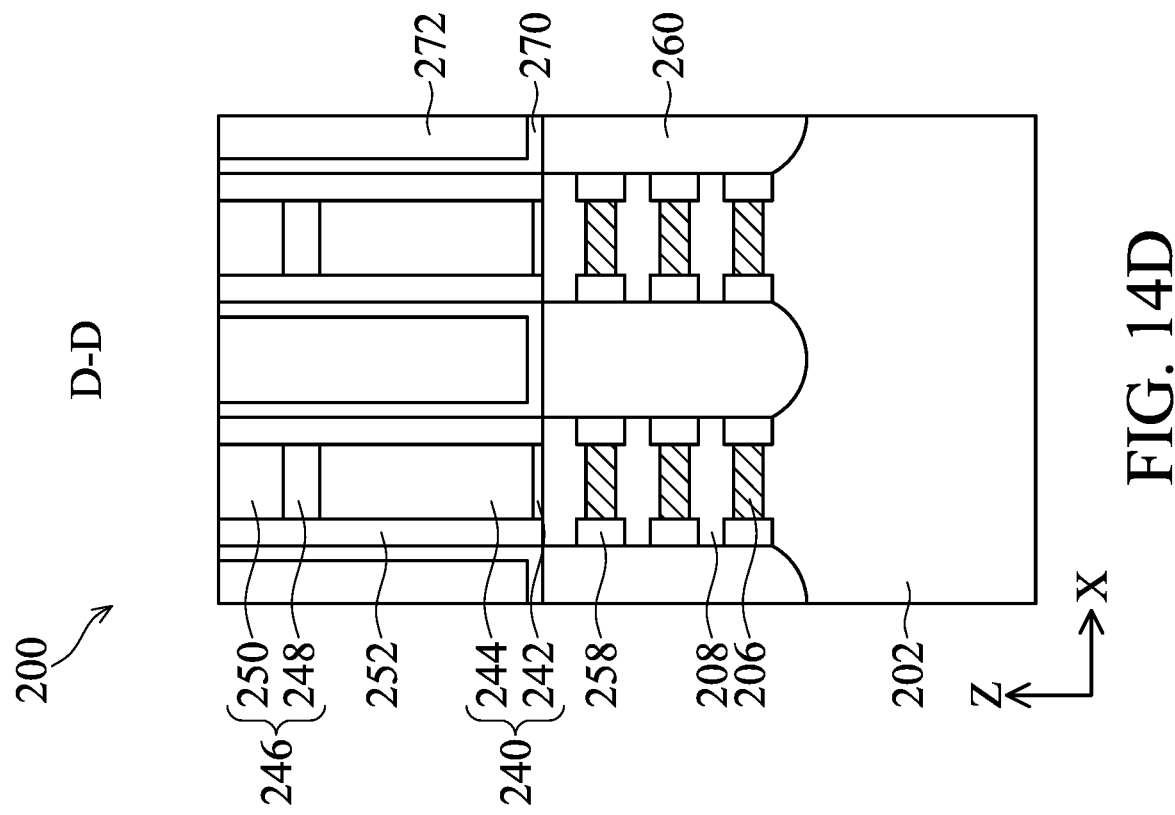
Figure 14C:
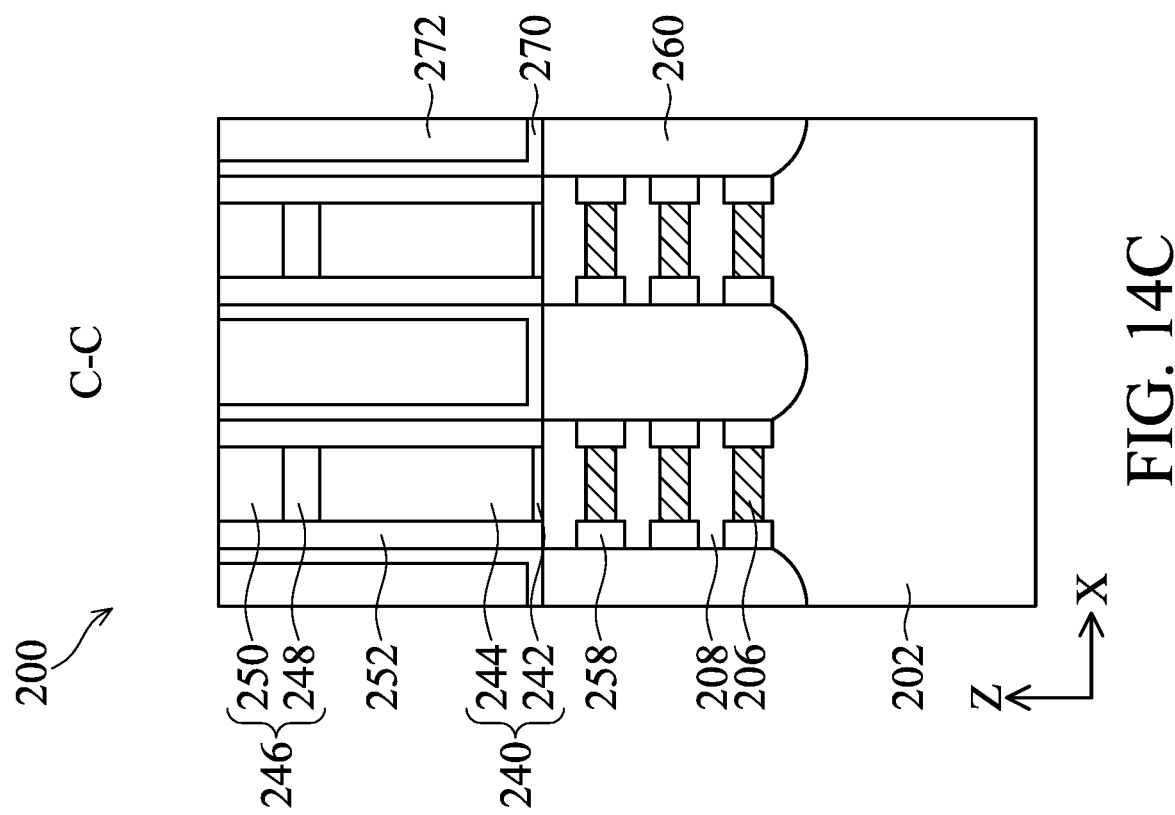
Figure 15C:
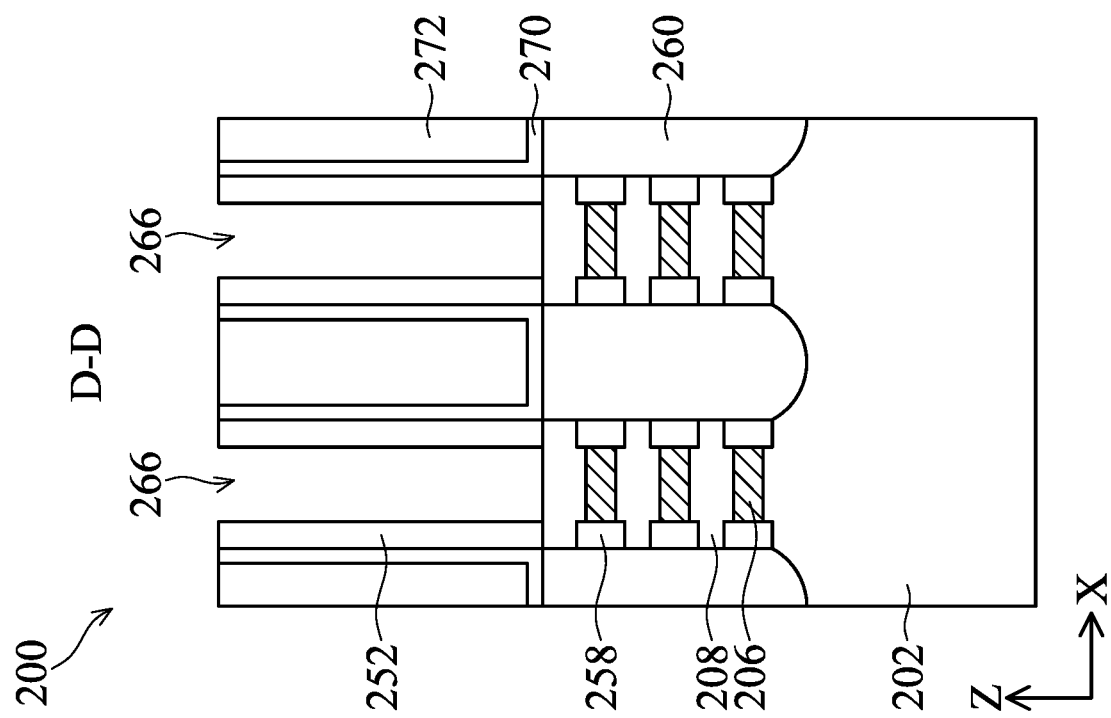
Figure 15D:
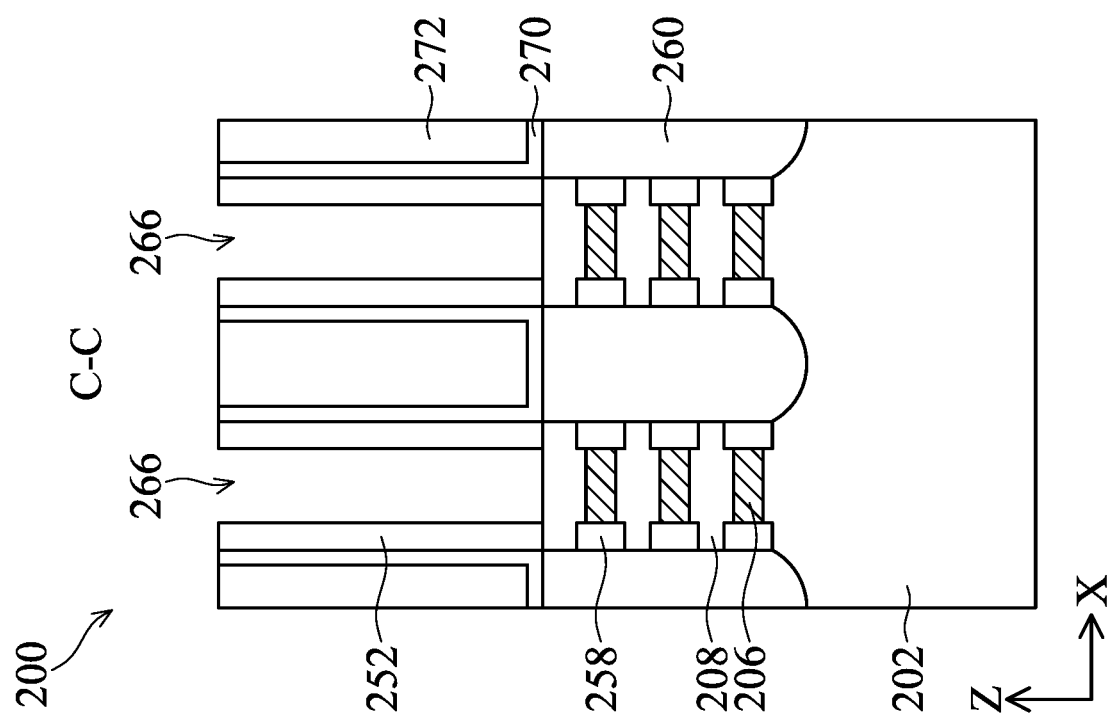
Figure 16C:
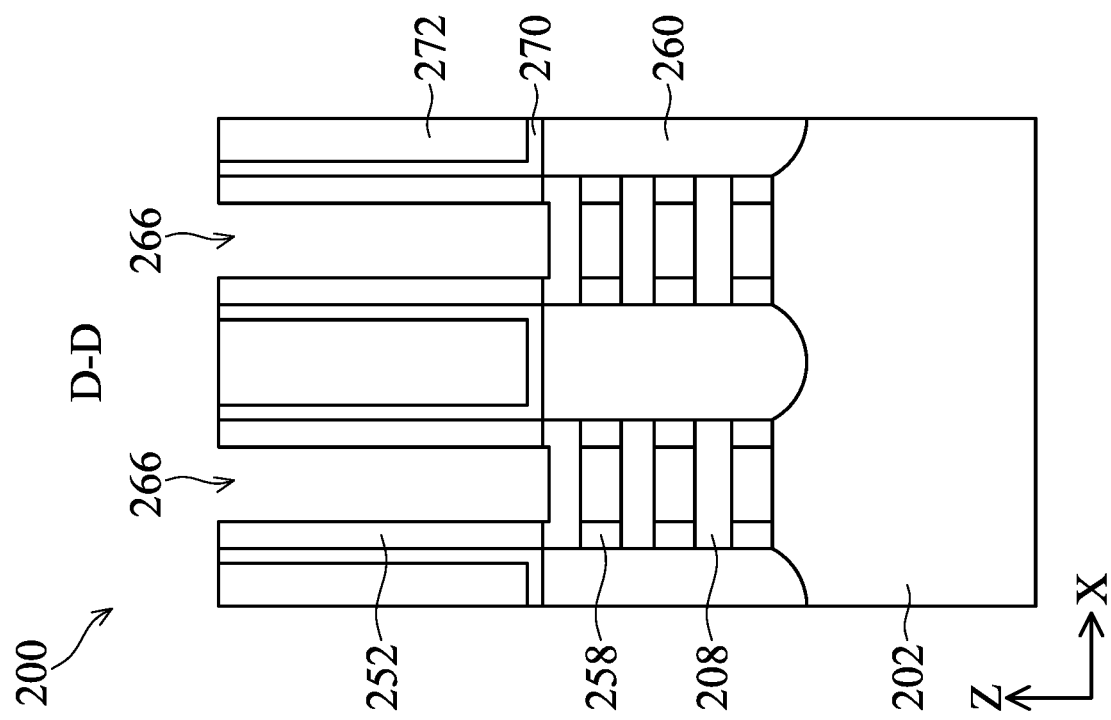
Figure 16D:
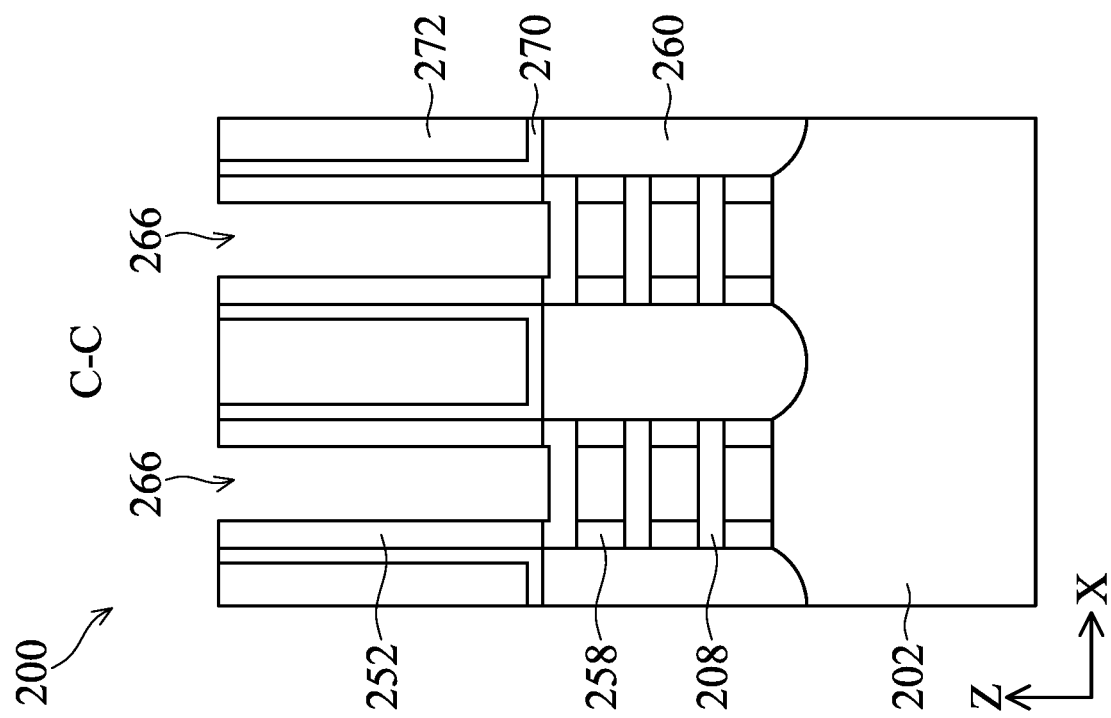
Figure 17A:
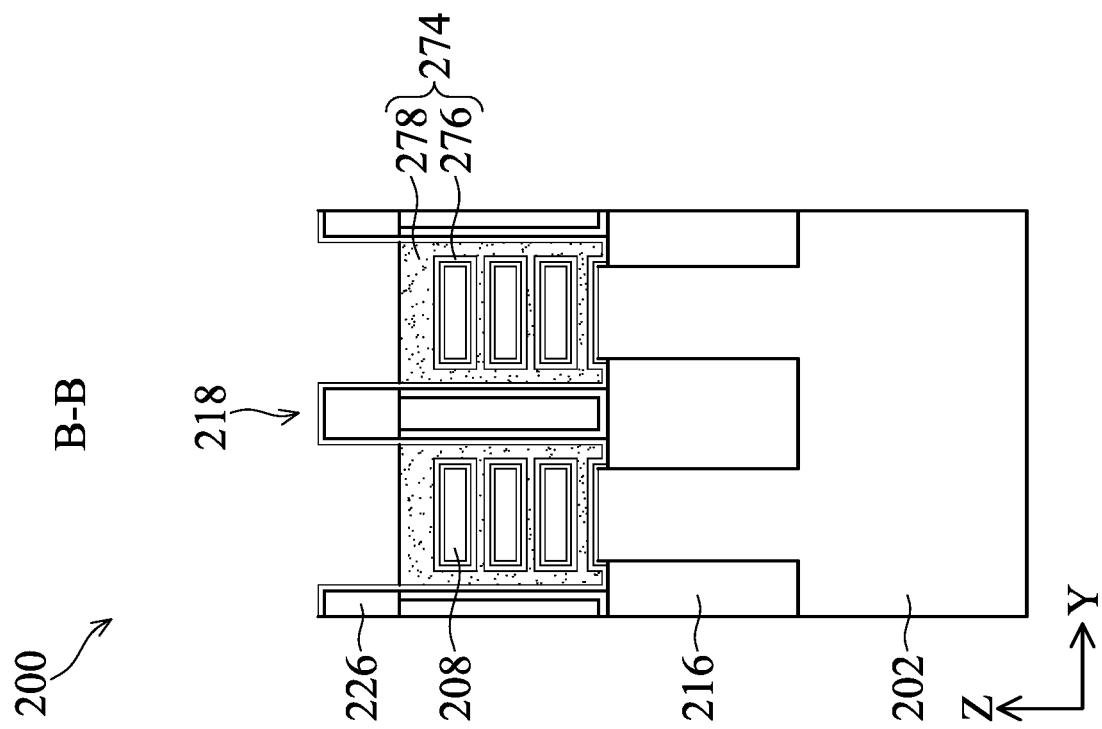
Figure 17B:
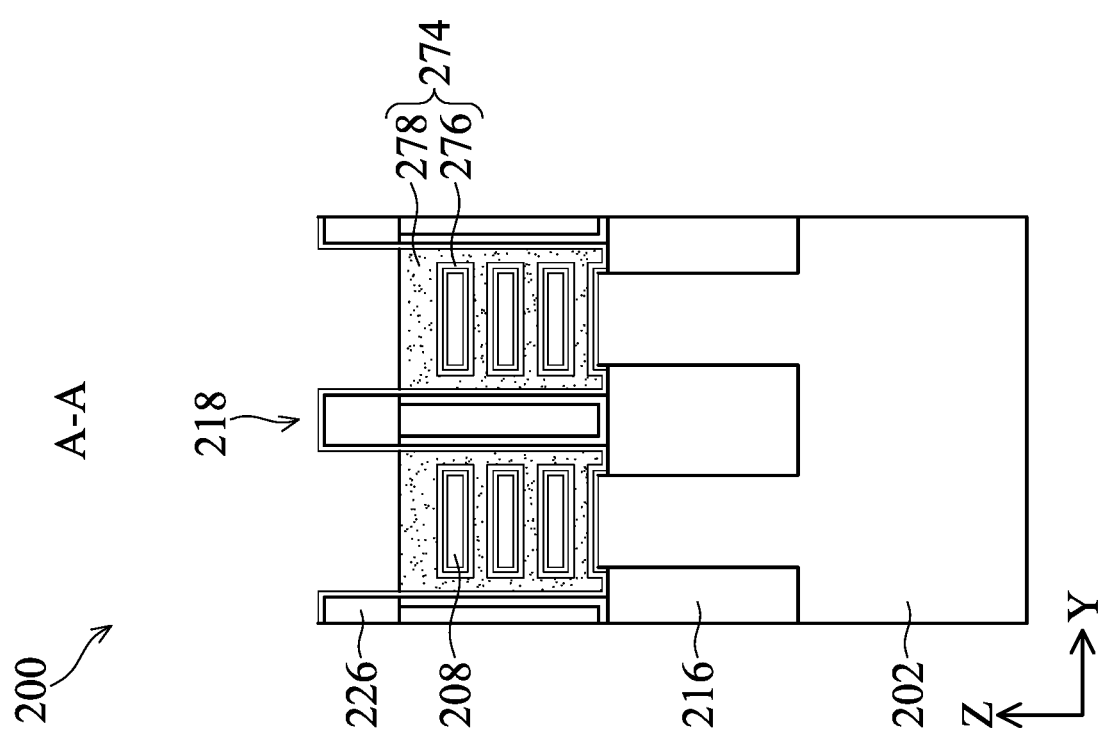
Figure 17C:
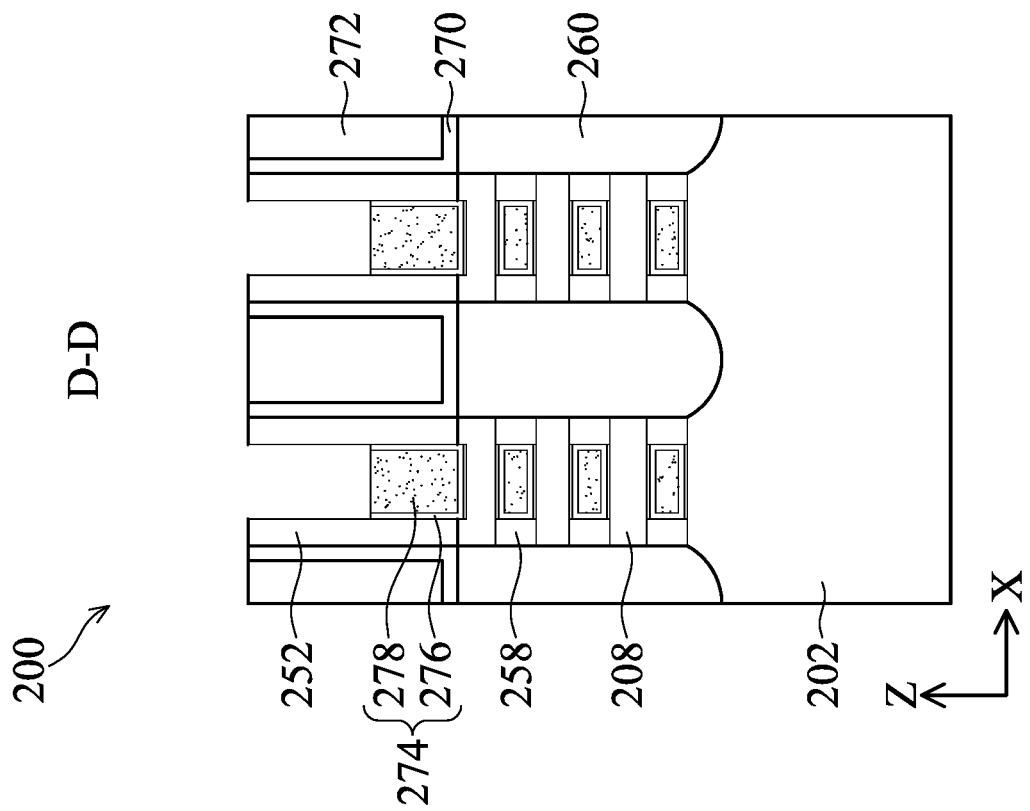
Figure 17D:
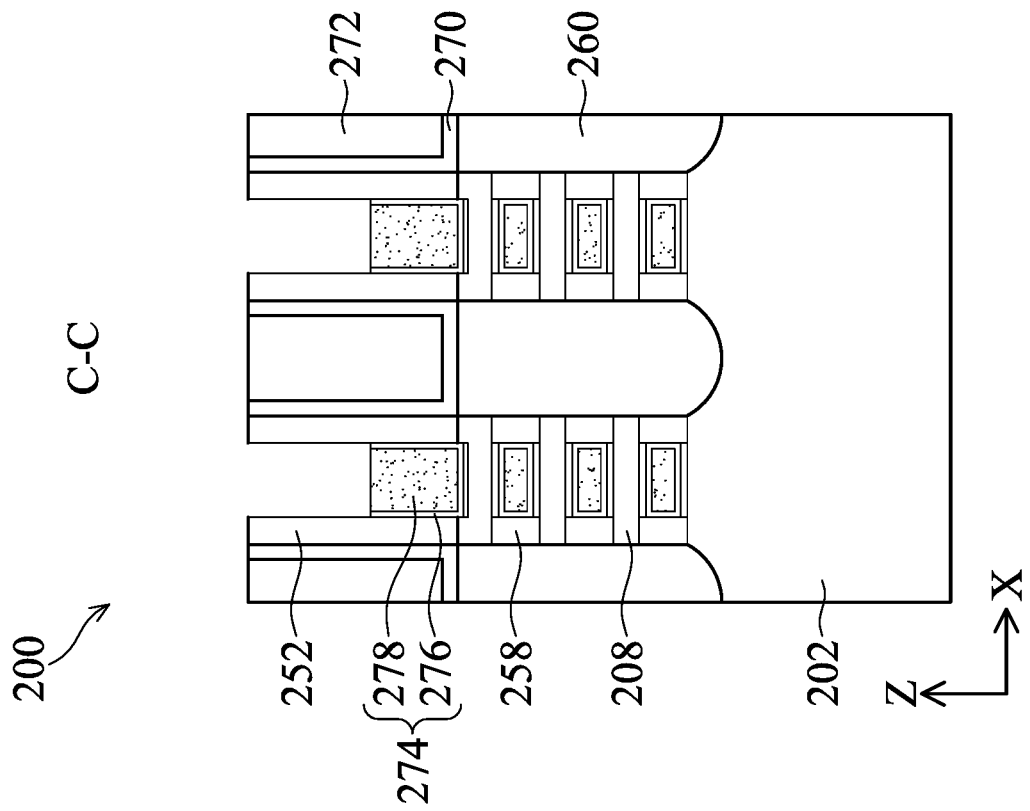
Figure 18D:
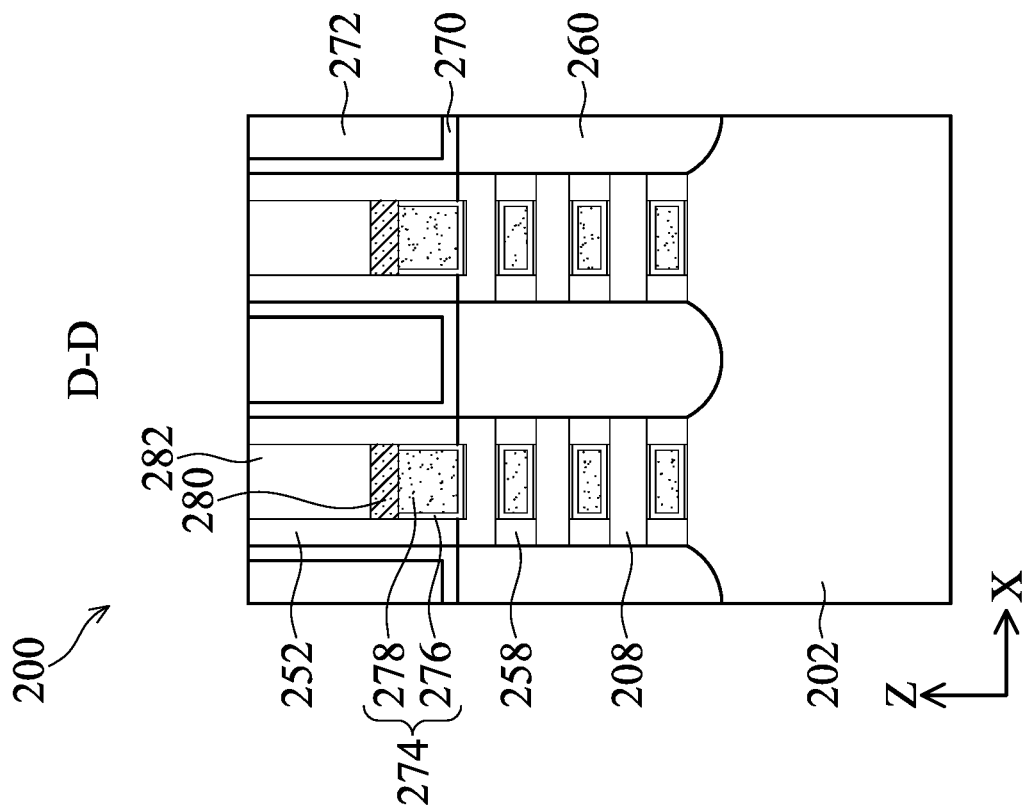
Figure 18C:
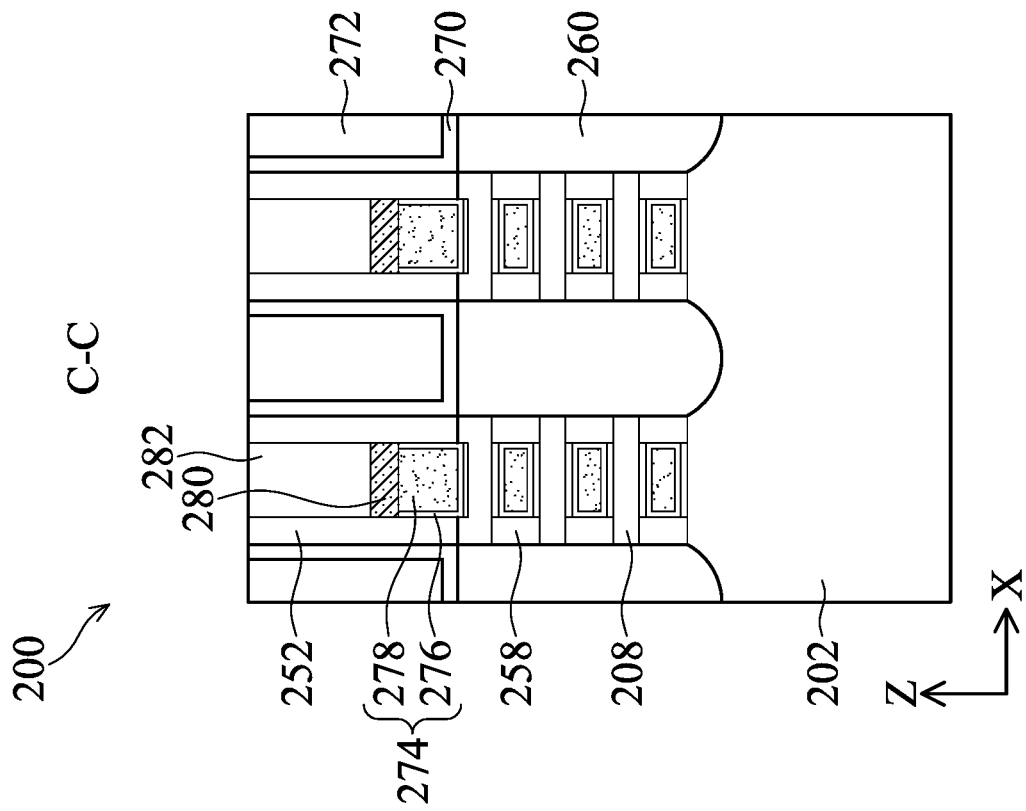

FIG. 2 illustrates a perspective view of the workpiece 200, and FIGS. 3A-18D illustrate cross-sectional views of the workpiece 200, in portion, along the A-A line, the B-B line, the C-C line, and the D-D line in FIG. 2, respectively. Particularly, the A-A line and the B-B line are fragmentary cross-sectional views in channel regions (i.e., a cut in a Y-Z plane in a channel region along the lengthwise direction of gate structures and perpendicular to the lengthwise direction of channel members) of the to-be-formed transistor(s) in the regions I and II, respectively; the C-C line and the D-D line are fragmentary cross-sectional views along the lengthwise direction of channel members (i.e., a cut in an X-Z plane along the lengthwise direction of channel members and though a channel region and abutting source/drain regions) of the to-be-formed transistor(s) in the regions I and II, respectively. In the present disclosure, a source and a drain are interchangeably used.

Referring to FIGS. 2 and 3A-3D, the method 100 includes a block 102 (FIG. 1A) where a p-well 203A and an n-well 203B are formed in a workpiece 200. The workpiece 200 includes a substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). In various embodiments, the substrate 202 is one substrate extending continuously from the region I to the region II, where region I includes the p-well 203A and region II includes the n-well 203B.

The p-well 203A may be formed using an ion implantation process to dope the substrate 202 of region I (e.g., FIGS. 3A and 3C) with a p-type dopant such as, for example, boron (B), boron difluoride ($BF_2$), or tetrafluoroborate ($BF_4$). The ion implantation process may dope the substrate 202 with the p-type dopant to a p-well doping concentration. The p-well doping concentration may be about $1\times10^{16}/cm^3$ to about $1\times10^{18}/cm^3$. In some embodiments, the p-well doping concentration may be higher or lower. The n-well 203B may be formed using an ion implantation process to dope the substrate 202 of region II (e.g., FIGS. 3B and 3D) with a n-type dopant such as, for example, phosphorus (P) or Arsenic (As). The ion implantation process may dope the substrate 202 with the n-type dopant to an n-well doping concentration. The n-well doping concentration may be about $1\times10^{17}/cm^3$ to about $1\times10^{19}/cm^3$. In some embodiments, the n-well doping concentration may be higher or lower.

Referring to FIGS. 2 and 4A-4D, the method 100 includes block 104 (FIG. 1A) where a stack 204 is formed over the workpiece 200, including over region I and region II of substrate 202 and the workpiece is annealed. The stack 204 may include alternating channel layers 208 and sacrificial layers 206 over the substrate 202, and a top sacrificial layer 206T over the sacrificial layers 206 and the channel layers 208. The channel layers 208 have a thickness t1 and the sacrificial layers 206 have a thickness t2 that is smaller than t1. Thickness t1 may be larger than thickness t2 by a ratio of about 1.4 to about 1.5 and may be about 1.46. If the ratio is larger than 1.5 there may not be sufficient space to form a metal gate that properly surrounds the channel layers 208. If the ratio is smaller than 1.4 then the performance of the device may be degraded.

The sacrificial layers 206, the channel layers 208, and the top sacrificial layer 206T may be deposited using an epitaxial process. Example epitaxial process may include vapor-phase epitaxy (VPE), ultra-high vacuum CVD (UHV-CVD)), molecular beam epitaxy (MBE), and/or other suitable processes. The channel layers 208 and the sacrificial layers 206 may have different semiconductor compositions. In some implementations, the channel layers 208 are formed of silicon (Si) and sacrificial layers 206 are formed of silicon germanium (SiGe). The additional germanium (Ge) content in the sacrificial layers 206 allow selective removal or recess of the sacrificial layers 206 without substantial etching of the channel layers 208. The sacrificial layers 206 and the channel layers 208 are disposed alternatingly such that the sacrificial layers 206 interleave the channel layers 208. FIG. 2 illustrates that three (3) layers of the sacrificial layers 206 and three (3) layers of the channel layers 208 are alternately and vertically arranged, which is for illustrative purposes only and not intended to be limiting beyond what is specifically recited in the claims. The number of layers depends on the desired number of channel layers 208 for the semiconductor device 200. In some embodiments, the number of the channel layers 208 is between 2 and 7.

Like the sacrificial layers 206, the top sacrificial layer 206T may be formed of silicon germanium (SiGe). In some instances, compositions of the sacrificial layers 206 and the top sacrificial layer 206T are substantially the same. The top sacrificial layer 206T may be thicker than the sacrificial layers 206 and functions to protect the stack 204 from damage during fabrication processes. In some instances, a thickness of the top sacrificial layer 206T may be between about 20 nm and about 40 nm while a thickness of a sacrificial layer 206 may be between about 4 nm and about 15 nm.

Still referring to FIGS. 4A-4D, the method 100 includes a block 106 (FIG. 1A) where an annealing process is performed on the workpiece 200. The annealing process may cause the p-type dopants within the p-well of region I to diffuse into the sacrificial layers 206 of region I to create doped sacrificial layers 206. The annealing process may further cause the n-type dopants within the n-well of region II to diffuse into the sacrificial layers 206 of region II to create doped sacrificial layers 206. The n-type dopants and the p-type dopants may diffuse into the sacrificial layers 206 at different rates. The diffusion of the n-type dopants and the p-type dopants may change the etching profile of the sacrificial layers 206 so that the sacrificial layers 206 of region I have first etching rate and the sacrificial layers 206 of region II have a second etching rate. In some embodiments, the first etching rate is different than the second etching rate. The annealing process may further cause diffusion of the n-type dopants and the p-type dopants into the channel layers 208. The concentration of n-type dopants and the p-type dopants diffused into the channel layers 208 is not high enough to degrade channel mobility. Therefore, the effect on the device performance is substantially insignificant. The annealing process may apply a temperature of about 900° C. to about 1000° C. to the workpiece 200. The annealing process may also apply a pressure of about 10 Torr to about 20 Torr to the workpiece. In some embodiments, the annealing process may be performed during a later step in the fabrication of the workpiece 200.

Referring to FIGS. 5A-5D, the method 100 includes a block 108 (FIG. 1A) where the stack 204 and the substrate 202 are patterned to form fin-shaped structures 210 separated by fin trenches 212. To pattern the stack 204 and the substrate 202, a hard mask layer 214 is deposited over the top sacrificial layer 206T. The hard mask layer 214 is then patterned to serve as an etch mask to pattern the top sacrificial layer 206T, the stack 204, and a top portion of the substrate 202. In some embodiments, the hard mask layer 214 may be deposited using CVD, plasma-enhanced CVD (PECVD), atomic layer deposition (ALD), plasma-enhanced ALD (PEALD), or another suitable deposition method. The hard mask layer 214 may be a single layer or a multi-layer. When the hard mask layer 214 is a multi-layer, the hard mask layer 214 may include a pad oxide and a pad nitride layer. In an alternative embodiment, the hard mask layer 214 may include silicon (Si). The fin-shaped structures 210 may be patterned using suitable processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the hard mask layer 214 and then the patterned hard mask layer 214 may be used as an etch mask to etch the stack 204 and the substrate 202 to form fin-shaped structures 210. The etching process can include dry etching, wet etching, reactive ion etching (RIE), and/or other suitable processes.

Still referring to FIGS. 5A-5D, each of the fin-shaped structures 210 includes a base portion 210B formed from a portion of the substrate 202 and a top portion 210T formed from the stack 204. The top portion 210T is disposed over the base portion 210B. The fin-shaped structures 210 extend lengthwise along the X direction and extend vertically along the Z direction from the substrate 202. Along the Y direction, the fin-shaped structures 210 are separated by fin trenches 212. In some instances, the fin trench 212 has a width ranging from about 20 nm to about 50 nm, defining a spacing between adjacent fin-shape structures 210.

Referring to FIGS. 6A-6D, the method 100 includes a block 110 (FIG. 1A) where an isolation feature 216 is formed in the fin trenches 212. The isolation feature 216 may be referred to as a shallow trench isolation (STI) feature 216. In an example process to form the isolation feature 216, a dielectric material is deposited over the workpiece 200, filling the fin trenches 212 with the dielectric material. In some embodiments, the dielectric material may include tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. In various examples, at block 106, the dielectric material may be deposited by flowable CVD (FCVD), spin-on coating, and/or other suitable process. The deposited dielectric material is then thinned and planarized, for example by a chemical mechanical polishing (CMP) process, until the hard mask layer 214 is exposed.

After the planarization, the deposited dielectric material is recessed in an etching-back process until the stack 204 fully rises above the isolation feature 216. The base portion 210B may also be partially exposed as shown in the illustrated embodiment. The etching-back process at block 110 may include, for example, wet etching, dry etching, reactive ion etching, or other suitable etching methods. The hard mask layer 214 may also be removed in the etching-back process, or other suitable processes, such as ashing or resist stripping.

Referring to FIGS. 7A-7D, 8A-8D, and 9A-9D, the method 100 includes a block 112 (FIG. 1A) where dielectric fins 218 are formed. In the illustrated embodiment, at block 112, the dielectric fins 218 are formed in the fin trenches 212. An example process to form the dielectric fins 218 includes conformally depositing a cladding layer 220 (as illustrated in FIGS. 7A-7D), conformally depositing a first dielectric layer 222 and depositing a second dielectric layer 224 in the fin trenches 212 (as illustrated in FIGS. 8A-8D), and depositing a high-k dielectric layer 226 on top of the first dielectric layer 222 and the second dielectric layer 224 (as illustrated in FIGS. 9A-9D).

The cladding layer 220 is deposited over the workpiece 200, including over the sidewalls of the stack 204 and a top portion of the base portion 210B in both regions I and II. In some embodiments, the cladding layer 220 may have a composition similar to that of the sacrificial layers 206 or the top sacrificial layer 206T. In one example, the cladding layer 220 may be formed of silicon germanium (SiGe). Their common composition allows selective and simultaneous removal of the sacrificial layers 206 and the cladding layer 220 in a subsequent etching process. In some embodiments, the cladding layer 220 may be conformally and epitaxially grown using vapor phase epitaxy (VPE) or molecular beam epitaxy (MBE). As shown in FIGS. 7A-7D, the cladding layer 220 is selectively disposed on exposed sidewall surfaces in the fin trenches 212. Depending on the extent of the selective growth of the cladding layer 220, an etching-back process may be performed to expose the isolation feature 216.

An example process to form the dielectric fins 218 further includes conformally depositing a first dielectric layer 222 and a second dielectric layer 224 over the workpiece 200 in sequence. The second dielectric layer 224 is surrounded by the first dielectric layer 222. The first dielectric layer 222 may be conformally deposited using CVD, ALD, or a suitable method. The first dielectric layer 222 lines the sidewalls and the bottom surfaces of the fin trenches 212. The second dielectric layer 224 is then conformally deposited over the first dielectric layer 222 using CVD, high density plasma CVD (HDPCVD), flowable CVD (FCVD), and/or other suitable process. In some instances, a dielectric constant of the second dielectric layer 224 is smaller than that of the first dielectric layer 222. The first dielectric layer 222 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. In one embodiment, the first dielectric layer 222 includes aluminum oxide. The second dielectric layer 224 may include silicon oxide, silicon carbide, silicon oxynitride, silicon oxycarbonitride, or a suitable dielectric material. In one embodiment, the second dielectric layer 224 includes silicon oxide. In some instances, as shown in FIGS. 8A-8D, after depositing the dielectric layers 222 and 224, a CMP process may be performed to remove excess material portions and to planarize a top surface of the workpiece 200 such that the top sacrificial layer 206T is exposed.

An example process to form the dielectric fins 218 may further include depositing a high-k dielectric layer 226. In some instances, a recessing process is performed to remove top portions of the dielectric layers 222 and 224. The recessing process may include a dry etching process, a wet etching process, and/or a combination thereof. In some embodiments, a recessing depth is controlled (e.g., by controlling an etching time) to result in a desired recess depth. After performing the recessing process, a high-K dielectric layer 226 is deposited within trenches formed by the recessing process. In some embodiments, the high-K dielectric layer 226 may include HfO2, ZrO2, HfAlOx, HfSiOx, Y2O3, Al2O3, or another high-K material. The high-K dielectric layer 226 may be deposited by a CVD process, an ALD process, a PVD process, and/or other suitable process. High-K dielectrics, as used and described herein, include dielectric materials having a high dielectric constant, for example, greater than that of thermal silicon oxide (~3.9). As shown in FIGS. 9A-9D, after deposition of the high-K dielectric layer 226, a CMP process is performed to remove excess material portions and to planarize a top surface of the workpiece 200. Upon conclusion of the block 112, the dielectric fins 218 are defined as having a lower portion including the recessed portions of the dielectric layers 222, 224 and an upper portion including the high-K dielectric layer 226. The dielectric fins 218 are also referred to as hybrid fins 218.

Referring to FIGS. 10A-10D, the method 100 includes a block 114 (FIG. 1A) where the top sacrificial layer 206T in the fin-shaped structures 210 is removed. At block 114, the workpiece 200 is etched to selectively remove the top sacrificial layer 206T and a portion of the cladding layer 220 to expose the topmost channel layer 208, without substantially damaging the dielectric fins 218. In some instances, because the top sacrificial layer 206T and the cladding layer 220 are formed of silicon germanium (SiGe), the etching process at the block 112 may be selective to silicon germanium (SiGe). For example, the cladding layer 220 and the top sacrificial layer 206T may be etched using a selective wet etching process that includes ammonium hydroxide (NH4OH), hydrogen fluoride (HF), hydrogen peroxide (H2O2), or a combination thereof. After the removal of the top sacrificial layer 206T and a portion of the cladding layer 220, the dielectric fins 218 rise above the topmost channel layer 208.

Referring to FIGS. 11A-11D, the method 100 includes a block 116 (FIG. 1A) where dummy gate stacks 240 are formed over the channel regions of the fin-shaped structures 210. In some embodiments, a gate replacement process (or gate-last process) is adopted where the dummy gate stacks 240 serve as a placeholder for functional gate structures. Other processes and configuration are possible. In the illustrated embodiment, the dummy gate stack 240 includes a dummy dielectric layer 242 and a dummy electrode 244 disposed over the dummy dielectric layer 242. For patterning purposes, a gate top hard mask 246 is deposited over the dummy gate stacks 240. The gate top hard mask 246 may be a multi-layer and include a silicon nitride mask layer 248 and a silicon oxide mask layer 250 over the silicon nitride mask layer 248. The regions of the fin-shaped structures 210 underlying the dummy gate stacks 240 may be referred to as channel regions. Each of the channel regions in a fin-shaped structure 210 is sandwiched between two source/drain regions for source/drain formation, as described below. In an example process, the dummy dielectric layer 242 is blanket deposited over the workpiece 200 by CVD. A material layer for the dummy electrode 244 is then blanket deposited over the dummy dielectric layer 242. The dummy dielectric layer 242 and the material layer for the dummy electrode 244 are then patterned using photolithography processes to form the dummy gate stacks 240. In some embodiments, the dummy dielectric layer 242 may include silicon oxide and the dummy electrode 244 may include polycrystalline silicon (polysilicon).

Still referring to FIGS. 11A-11D, the method 100 includes a block 118 (FIG. 1A) where gate spacers 252 are formed along sidewalls of the dummy gate stacks 240. The gate spacers 252 may include two or more gate spacer layers. Dielectric materials for the gate spacers 252 may be selected to allow selective removal of the dummy gate stacks 240. Suitable dielectric materials may include silicon nitride, silicon oxycarbonitride, silicon carbonitride, silicon oxide, silicon oxycarbide, silicon carbide, silicon oxynitride, and/or combinations thereof. In an example process, the gate spacers 252 may be conformally deposited over the workpiece 200 using CVD, subatmospheric CVD (SACVD), or ALD, and then be anisotropically etched to remove horizontal portions while vertical portions of the gate spacers 252 remain on the sidewalls of the dummy gate stacks 240.

Referring to FIGS. 12A-12D, the method 100 includes a block 120 (FIG. 1A) where the source/drain regions of the fin-shaped structures 210 are recessed to form source recesses and drain recesses, collectively referred to as source/drain recesses 254 (or source/drain trenches 254). With the dummy gate stack 240 and the gate spacers 252 serving as an etch mask, the workpiece 200 is anisotropically etched to form the source/drain recesses 254 over the source/drain regions of the fin-shaped structures 210. In the illustrated embodiment, operations at the block 118 remove the sacrificial layers 206, the channel layers 208, and the cladding layers 220 from the source/drain regions in both regions I and II thereby exposing the base portion 210B. The anisotropic etch at the block 120 may include a dry etching process. For example, the dry etching process may implement hydrogen, a fluorine-containing gas (e.g., CF4, SF6, CH2F2, CHF3, and/or C2F6), a chlorine-containing gas (e.g., Cl2, CHCl3, CCl4, and/or BCl3), a bromine-containing gas (e.g., HBr and/or CHBr3), an iodine-containing gas, other suitable gases and/or plasmas, and/or combinations thereof.

Referring to FIGS. 13A-13D, the method 100 includes a block 122 where inner spacer features 258 are formed. In some embodiments, at the block 122, the sacrificial layers 206 exposed in the source/drain recesses 254 are first selectively and partially recessed to form inner spacer recesses, while the exposed channel layers 208 are substantially unetched. In an embodiment where the channel layers 208 consist essentially of silicon (Si) and the sacrificial layers 206 consist essentially of silicon germanium (SiGe), the selective and partial recess of the sacrificial layers 206 may include a SiGe oxidation process followed by a SiGe oxide removal. In that embodiment, the SiGe oxidation process may include the use of ozone. In some other embodiments, the partial recess may include a selective etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include ammonium hydroxide (NH4OH), hydrogen fluoride (HF), hydrogen peroxide (H2O2), or a combination thereof (e.g. an APM etch that includes an ammonia hydroxide-hydrogen peroxide-water mixture). After the formation of the inner spacer recesses, an inner spacer material layer is then conformally deposited using CVD or ALD over the workpiece 200, including over and into the inner spacer recesses. The inner spacer material may include silicon nitride, silicon oxycarbonitride, silicon carbonitride, silicon oxide, silicon oxycarbide, silicon carbide, or silicon oxynitride. After the deposition of the inner spacer material layer, the inner spacer material layer is etched back to form inner spacer features 258, as illustrated in FIGS. 13A-13D.

Still referring to FIGS. 13A-13D, the method 100 includes a block 124 where source/drain features 260 are formed. The source/drain features 260 are selectively and epitaxially deposited on the exposed semiconductor surfaces of the channel layers 208 and the base portion 210B in the source/drain recesses 254. The source/drain features 260 may be deposited using an epitaxial process, such as vapor-phase epitaxy (VPE), ultra-high vacuum CVD (UHV-CVD), molecular beam epitaxy (MBE), and/or other suitable processes. The source/drain features 260 may include Ge, Si, GaAs, AlGaAs, SiGe, GaAsP, SiP, or other suitable material. In some embodiments, the source/drain features 260 may be in-situ doped during the epi process. For example, in some embodiments, epitaxially grown SiGe source/drain features may be doped with boron. In some cases, epitaxially grown Si epi source/drain features may be doped with carbon to form Si:C source/drain features, phosphorous to form Si:P source/drain features, or both carbon and phosphorous to form SiCP source/drain features. In some embodiments, the source/drain features 260 are not in-situ doped, and instead an implantation process is performed to dope the source/drain features 260. The etching process can include dry etching, wet etching, reactive ion etching (RIE), and/or other suitable processes.

Referring to FIGS. 14A-14D, the method 100 includes a block 126 (FIG. 1A) where a contact etch stop layer (CESL) 270 and an interlayer dielectric (ILD) 272 layer are deposited over workpiece 200. In an example process, the CESL 270 is first conformally deposited over the workpiece 200 and then the ILD layer 272 is blanket deposited over the CESL 270. The CESL 270 may include silicon nitride, silicon oxide, silicon oxynitride, and/or other materials known in the art. The CESL 270 may be deposited using ALD, plasma-enhanced chemical vapor deposition (PECVD) process and/or other suitable deposition or oxidation processes. In some embodiments, the ILD layer 272 includes materials such as tetraethylorthosilicate (TEOS) oxide, un-doped silicate glass, or doped silicon oxide such as borophosphosilicate glass (BPSG), fluorosilicate glass (FSG), phosphosilicate glass (PSG), boron doped silicon glass (BSG), and/or other suitable dielectric materials. The ILD layer 272 may be deposited by spin-on coating, an FCVD process, or other suitable deposition technique. In some embodiments, after formation of the ILD layer 272, the workpiece 200 may be annealed to improve integrity of the ILD layer 272. To remove excess materials (including the gate top hard mask 246) and to expose top surfaces of the dummy electrode 244 of the dummy gate stacks 240, a planarization process (such as a CMP process) may be performed to the workpiece 200 to provide a planar top surface.

Referring to FIGS. 15A-15D, the method 100 includes a block 128 (FIG. 1A) where the dummy gate stacks 240 are selectively removed. The dummy gate stacks 240 exposed at the conclusion of block 126 are removed from the workpiece 200 by a selective etching process. The selective etching process may be a selective wet etching process, a selective dry etching process, or a combination thereof. In the depicted embodiments, the selective etching process selectively removes the dummy dielectric layer 242 and the dummy electrode 244 without substantially damaging the channel layers 208 and the gate spacers 252. The removal of the dummy gate stacks 240 results in gate trenches 266 over the channel regions. After the removal of the dummy gate stacks 240, the channel layers 208, the sacrificial layers 206, and the cladding layer 220 in the channel regions are exposed in the gate trenches 266.

Referring to FIGS. 16A-16D, the method 100 includes a block 130 (FIG. 1A) where the sacrificial layers 206 and the cladding layer 220 are removed from the gate trenches 266 to release the channel layers 208. A global etching process is performed to selectively remove the sacrificial layers 206 and the cladding layer 220. As discussed above, the annealing process of block 106 diffused the p-type dopants of the p-well into the sacrificial layers 206 in region I and diffused the n-type dopants of the n-well into sacrificial layers 206 in region II. Because of this, the sacrificial layers 206 in region I have a first etching rate and the sacrificial layers 206 in region II have a second etching rate that is different than the first etching rate. When the etching process is performed, the sacrificial layers 206 and cladding layer 200 are removed.

The released channel layers 208 in region I have a third thickness t3 of about 8 nm to about 12 nm. The released channel layers 208 in region II have a fourth thickness t4 of about 9 nm to about 13 nm. Thickness t4 may be larger than thickness t3 by about 0.3 nm to about 0.8 nm. The difference in thickness is due to the different etching rates of the differently doped sacrificial layers 206. For example, the sacrificial layers 206 in region I may have a faster etching rate than the sacrificial layers 206 in region II. After removing all of the sacrificial layers 206 in region I, the etchants remove a portion of the channel layers 208 in region I. This results in the channel layers 208 in region II having a greater thickness t4 than the channel layers 208 in region I. The difference in channel layer 208 thickness improves the speed of the device by balancing the drain induced barrier lowering and the effective drive current. Additionally, the physical height of the NMOS and PMOS devices are not affected as the channel layer 208 thickness is caused by the etching of the sacrificial layers 206.

The released channel layers 208 at the conclusion of the block 130 are also referred to as the channel members 208. In the depicted embodiments where the channel members 208 resemble a sheet or a nanosheet, the channel member release process may also be referred to as a sheet formation process. The channel members 208 are vertically stacked along the Z direction. All channel members 208 are spaced laterally apart from the dielectric fins 218 by a distance defined by a thickness of the cladding layer 220. The selective removal of the sacrificial layers 206 and the cladding layer 220 may be implemented by selective dry etching, selective wet etching, or other selective etching processes. In some embodiments, the selective wet etching includes ammonium hydroxide ($NH_4OH$), hydrogen fluoride (HF), hydrogen peroxide ($H_2O_2$), or a combination thereof (e.g., an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by an ozone clean followed by silicon germanium oxide removal using an etchant such as $NH_4OH$.

Referring to FIGS. 17A-17D, the method 100 includes a block 132 (FIG. 1B) where gate structures 274 (also known as functional gate structures 274 or metal gate structures 274) are formed in the gate trenches 266 to engage the channel members 208. In both regions I and II, each of the channel members 208 is wrapped around by a respective gate structure 274. Each of the gate structures 274 includes a gate dielectric layer 276 disposed on the channel members 208 and a gate electrode layer 278 over the gate dielectric layer 276. In some embodiments, the gate dielectric layer 276 includes an interfacial layer and a high-k dielectric layer. The interfacial layer may include silicon oxide and be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 208 to form the interfacial layer. The high-k dielectric layer is then deposited over the interfacial layer using ALD, CVD, and/or other suitable methods. The high-k dielectric layer includes high-K dielectric materials. In one embodiment, the high-k dielectric layer may include hafnium oxide. Alternatively, the high-k dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), (Ba,Sr)$TiO_3$ (BST), silicon nitride (SiN), silicon oxynitride (SiON), combinations thereof, or other suitable material. After the formation of the gate dielectric layer 276, the gate electrode layer 278 is deposited over the gate dielectric layer 276. The gate electrode layer 278 may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer 278 may be formed by ALD, PVD, CVD, e-beam evaporation, or other suitable process. Although not explicitly shown in the figures, the gate structures 274 are deposited as a joint gate structure and then etched back until the dielectric fins 218 separate the joint gate structure into the gate structures 274 that are separated apart from each other. The dielectric fins 218 also provide electrical isolation between neighboring gate structures 274. The etching back of the gate structures 274 may include a selective wet etching process that uses nitric acid, hydrochloric acid, sulfuric acid, ammonium hydroxide, hydrogen peroxide, or a combination thereof. Although in the illustrated embodiments, the top surface of the gate structures 274 after the etching back process appears level with the bottom surface of the high-k dielectric layer 226, in alternative embodiments, the top surface of the gate structures 274 after the etching back process may be below the bottom surface of the high-k dielectric layer 226. The etching back of the gate structures 274 may also include etching back the high-k dielectric layer 226 of the dielectric fins 218 in the channel regions.

Referring to FIGS. 18A-18D, the method 100 includes a block 134 (FIG. 1B) where a metal cap layer 280, a self-aligned cap (SAC) layer 282, and a gate cut feature 284 are formed on the frontside of the workpiece 200. In some embodiments, the metal cap layer 280 may include titanium (Ti), titanium nitride (TiN), tantalum nitride (TaN), tungsten (W), ruthenium (Ru), cobalt (Co), or nickel (Ni) and may be deposited using PVD, CVD, or metal organic chemical vapor deposition (MOCVD). In one embodiment, the metal cap layer 280 includes tungsten (W), such as fluorine-free tungsten (FFW), and is deposited by PVD. In some alternative embodiments where the metal cap layer 280 is deposited by MOCVD, the deposition of the metal cap layer 280 may be selectively deposited on the gate structures 274. After the deposition of the metal cap layer 280, the SAC layer 282 is deposited over the workpiece 200 by CVD, PECVD, or a suitable deposition process. The SAC layer 282 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. Photolithography processes and etching processes are then performed to etch the deposited SAC layer 282 to form gate cut openings to expose the top surfaces of the dielectric fins 218, including removing the high-k dielectric layer 226. Thereafter, a dielectric material is deposited and planarized by a CMP process to form the gate cut features 284 in the gate cut openings. The dielectric material for the gate cut features 284 may be deposited using HDPCVD, CVD, ALD, or a suitable deposition technique. In some instances, the gate cut features 284 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, or a suitable dielectric material. In some embodiments, the gate cut features 284 and the SAC layer 282 may have different compositions to introduce etch selectivity.

Still referring to FIGS. 18A-18D, the method 100 includes a block 136 (FIG. 1B) where further fabrication processes are performed to the workpiece 200. For example, BEOL processes may be performed to form interconnect layers, such as frontside power rails, on the frontside of the workpiece 200. In an embodiment, frontside power rails may be formed using a damascene process, a dual-damascene process, a metal patterning process, or other suitable processes. The frontside power rails may include tungsten (W), cobalt (Co), molybdenum (Mo), ruthenium (Ru), copper (Cu), nickel (Ni), titanium (Ti), tantalum (Ta), titanium nitride (TiN), tantalum nitride (TaN), or other metals, and may be deposited by CVD, PVD, ALD, plating, or other suitable processes. Operations at the block 136 may also include forming passivation layers on the frontside of the workpiece 200, performing other BEOL processes, and removing a backside carrier.

Still referring to FIGS. 18A-18D, upon conclusion of the method 100, multiple GAA transistors are formed in the region I and the region II, respectively. Each GAA transistor includes a gate structure 274 engaging one or more channel members 208. Adjacent GAA transistors are electrically separated from each other by the dielectric fins 218 and the gate cut features 284 landing on the dielectric fins 218. Particularly, the GAA transistors in region I have channel members 208 that are thinner than the GAA transistors in region II, thereby balancing the performance of the devices, such as drain induce barrier lowering and effective drive current. This balancing of the performance advantageously improves speed performance in CMOS devices. By achieving the difference in channel member thickness through etching, the thickness may be better controlled without affecting the loading at the barrier between NMOS and PMOS regions (e.g., device height) that may occur by using an epitaxial growth process.

The present disclosure provides for many different embodiments. By way of example, one of the embodiments of the present disclosure described a method that includes forming a p-well and an n-well in a substrate. The method further includes forming a stack of interleaving first semiconductor material layers and second semiconductor material layers over the p-well and the n-well, the first semiconductor material layers having a first thickness and the second semiconductor material layers having a second thickness that is different than the first thickness. The method further includes annealing the stack of interleaving semiconductor layers. In some embodiments, the method further includes patterning the stack to form fin-shaped structures including a first fin-shaped structure over the n-well and a second fin-shaped structure over the p-well. The method further includes performing an etching process to remove the second semiconductor material layers from the first and second fin-shaped structures, where the first semiconductor material layers have a different thickness within each of the first and second fin-shaped structures after the etching process. The method further includes forming a metal gate over the first and second fin-shaped structures.

In another of the embodiments, discussed is a method that includes receiving a substrate including a p-well and an n-well. The method further includes forming a stack of semiconductor layers over the substrate including over the p-well and over the n-well, the stack of semiconductor layers including alternating layers of a first semiconductor material and a second semiconductor material. In some embodiments, the method further includes performing an annealing process to the stack of semiconductor layers to drive dopants from the p-well into the second semiconductor layers that are formed over the p-well. The method further includes etching the stack of semiconductor layers to form a first fin-shaped structure over the p-well and a second fin-shaped structure over the n-well. In some examples, the method further includes removing the second semiconductor layers from the first fin-shaped structure and the second fin-shaped structure, where the first semiconductor material layer has a different thickness within each of the first and second fin-shaped structures after removing the second semiconductor layers In yet another of the embodiments, discussed is a device including a substrate. The device further includes a first fin-shaped structure disposed over a first region of the substrate, including a first set of channel layers having a first thickness. The device further includes a second fin-shaped structure disposed over a second region of the substrate, including a second set of channel layers having a second thickness, the second thickness being larger than the first thickness. In some embodiments, the device further includes a gate structure disposed on first and second fin-shaped structures including around the first and second sets of channel layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a p-well and an n-well in a substrate;
forming a stack of interleaving first semiconductor material layers and second semiconductor material layers over the p-well and the n-well, the first semiconductor material layers having a first thickness and the second semiconductor material layers having a second thickness that is different than the first thickness;
annealing the stack of interleaving semiconductor layers;
patterning the stack to form fin-shaped structures including a first fin-shaped structure over the n-well and a second fin-shaped structure over the p-well;
performing an etching process to remove the second semiconductor material layers from the first and second fin-shaped structures, wherein the first semiconductor material layers have a different thickness within each of the first and second fin-shaped structures after the etching process; and forming a metal gate over the first and second fin-shaped structures.

2. The method of claim 1, wherein a ratio of the first thickness to the second thickness is about 1.4 to about 1.5.

3. The method of claim 1, wherein the annealing diffuses first dopants in the n-well into the second material layer formed over the p-well and diffuses second dopants in the p-well into the second material layer formed over the n-well.

4. The method of claim 3, wherein the first dopants reduce an etching rate of the second material layer formed over the p-well.

5. The method of claim 1, wherein the performing the etching process further includes etching a portion of the first material layer over the p-well after removing the second material layer over the p-well.

6. The method of claim 1, wherein the etching process is a global etching process that is performed on the first fin-shaped structure and the second fin-shaped structure at the same time.

7. The method of claim 1, wherein the forming the p-well further comprises:

performing an ion implantation process to dope the substrate with one of B or $BF_4$.

8. A method, comprising:

receiving a substrate including a p-well and an n-well;

forming a stack of semiconductor layers over the substrate including over the p-well and over the n-well, the stack of semiconductor layers including alternating layers of a first semiconductor material and a second semiconductor material;

performing an annealing process to the stack of semiconductor layers to drive dopants from the p-well into the second semiconductor layers that are formed over the p-well;

etching the stack of semiconductor layers to form a first fin-shaped structure over the p-well and a second fin-shaped structure over the n-well; and removing the second semiconductor layers from the first fin-shaped structure and the second fin-shaped structure, wherein the first semiconductor material layer has a different thickness within each of the first and second fin-shaped structures after removing the second semiconductor layers.

9. The method of claim 8, wherein the removing the second semiconductor layers further comprises:

removing a first portion of the second semiconductor layer from the first fin-shaped structure and a second portion of the second semiconductor layer from the second fin-shaped structure at the same time, wherein the first portion is removed at a faster rate than the second portion; and removing a portion of the first semiconductor layer from the first fin-shaped structure.

10. The method of claim 9, further comprising removing the portion of the first semiconductor layer until it is about 0.5 nm thinner than a first semiconductor layer of the second fin-shaped structure.

11. The method of claim 8, wherein the performing the annealing process further comprises driving dopants from the n-well into the second semiconductor layers over the n-well.

12. The method of claim 8, wherein the forming the stack of semiconductor layers further includes:

forming the first semiconductor material layers to a first thickness; and forming the second semiconductor material layer to a second thickness, wherein the first thickness is larger than the second thickness.

13. The method of claim 12, where in the first thickness is about 1.4 to about 1.5 times larger than the second thickness.

14. The method of claim 12, further comprising:

forming three layers of the first semiconductor material.

15. A device, comprising:

a substrate;

a first fin-shaped structure disposed over a first region of the substrate, including a first set of channel layers having a first thickness;

a second fin-shaped structure disposed over a second region of the substrate, including a second set of channel layers having a second thickness, the second thickness being larger than the first thickness; and a gate structure disposed on first and second fin-shaped structures including around the first and second sets of channel layers.

16. The device of claim 15, wherein the first region further comprises a p-well disposed in the substrate and under the first fin-shaped structure.

17. The device of claim 15, wherein the second region further comprises an n-well disposed in the substrate and under the second fin-shaped structure.

18. The device of claim 15, further comprising:

a distance between a first channel layer and a second channel layer of the second fin-shaped structure, wherein the second thickness is about 1.4 times larger than the distance.

19. The device of claim 18, wherein the first thickness is less than 1.4 times larger than the distance.

20. The device of claim 15, wherein the first fin-shaped structure has a same height as the second fin-shaped structure.

* * * * *